US005534711A

United States Patent [19]
Ovshinsky et al.

[11] Patent Number: 5,534,711
[45] Date of Patent: Jul. 9, 1996

[54] ELECTRICALLY ERASABLE, DIRECTLY OVERWRITABLE, MULTIBIT SINGLE CELL MEMORY ELEMENTS AND ARRAYS FABRICATED THEREFROM

[75] Inventors: Stanford R. Ovshinsky, Bloomfield Hills; David A. Strand, Bloomfield Township; Wolodymyr Czubatyj, Warren; Patrick Klersy, Madison Heights, all of Mich.

[73] Assignee: Energy Conversion Devices, Inc., Troy, Mich.

[21] Appl. No.: 423,484

[22] Filed: Apr. 19, 1995

Related U.S. Application Data

[63] Continuation-in-part of Ser. No. 789,234, Nov. 7, 1991, Pat. No. 5,414,271, which is a continuation-in-part of Ser. No. 768,139, Sep. 30, 1991, Pat. No. 5,335,219, and a continuation-in-part of Ser. No. 747,053, Aug. 19, 1991, Pat. No. 5,296,716, which is a continuation-in-part of Ser. No. 642,984, Jan. 18, 1991, Pat. No. 5,166,758.

[51] Int. Cl.$^6$ ................................................. H01L 45/00
[52] U.S. Cl. ........................................ 257/3; 257/2; 257/5
[58] Field of Search ........................................ 257/2–5

[56] References Cited

U.S. PATENT DOCUMENTS

| 5,406,509 | 4/1995 | Ovshinsky | 257/3 |
| 5,414,271 | 5/1995 | Ovshinsky | 257/3 |

Primary Examiner—William D. Larkins
Attorney, Agent, or Firm—David W. Schumaker; Marvin S. Siskind; Marc J. Luddy

[57] ABSTRACT

The present invention comprises an electrically operated, directly overwritable, multibit, single-cell memory element. The memory element includes a volume of memory material which defines the single cell memory element. The memory material is characterized by: (1) a large dynamic range of electrical resistance values; and (2) the ability to be set at one of a plurality of resistance values within said dynamic range in response to selected electrical input signals so as to provide said single cell with multibit storage capabilities. The memory element also includes a pair of spacedly disposed contacts for supplying the electrical input signal to set the memory material to a selected resistance value within the dynamic range. At least a filamentary portion of the single cell memory element being setable, by the selected electrical signal to any resistance value in said dynamic range, regardless of the previous resistance value of said material. The memory element further includes a filamentary portion controlling means disposed between the volume of memory material and at least one of the spacedly disposed contacts. The controlling means defining the size and position of the filamentary portion during electrical formation of the memory element and limiting the size and confining the location of the filamentary portion during use of the memory element, thereby providing for a high current density within the filamentary portion of the single cell memory element upon input of a very low total current electrical signal to the spacedly disposed contacts.

21 Claims, 11 Drawing Sheets

ELECTRICALLY ERASABLE, DIRECTLY OVERWRITABLE, MULTIBIT SINGLE CELL MEMORY ELEMENTS AND ARRAYS FABRICATED THEREFROM

RELATED APPLICATION INFORMATION

This application is a continuation-in-part of U.S. application Ser. No. 07/789,234 filed Nov. 7, 1991, now U.S. Pat. No. 5,414,271 which is a continuation-in-part of U.S. application Ser. No. 07/768,139, filed Sep. 30, 1991, now U.S. Pat. No. 5,335,219, and a continuation-in-part of U.S. application Ser. No. 07/747,053 filed Aug. 19, 1991, now U.S. Pat. No. 5,296,716, each of which in turn is a continuation-in-part of U.S. application Ser. No. 07/642,984 filed Jan. 18, 1991, now U.S. Pat. No. 5,166,758.

FIELD OF THE INVENTION

The present invention relates generally to a unique new class of semiconductor materials characterized by a high concentration of modulatable free charge carders. The mechanism of operation of devices fabricated from this new class of semiconductor materials is different from the operation of previous semiconductor devices and can be tailored to provide new device configurations exhibiting unusual new properties. More particularly, it relates to a new class of narrow band gap, microcrystalline semiconductor materials, per se; to these materials as specifically designed for solid state, electrically and optically operated, directly overwritable, low energy, very fast switching, non-volatile, analogue and multilevel single-cell operating memory elements; and to high density electrical memory arrays fabricated from these materials.

BACKGROUND AND PRIOR ART

The Ovonic EEPROM is a novel, proprietary, high performance, non-volatile, thin film electronic memory device. In this device, information can be stored in either analog or binary form (one bit per cell) or in multi-state form (multiple bits per memory cell). The advantages of the Ovonic EEPROM include non-volatile storage of dam, potential for high bit density and consequently low cost as a result of its small footprint and simple two-terminal device configuration, long reprogramming cycle life, low programming energies and high speed. The Ovonic EEPROM is capable of binary and multistate operation. There are small differences in the structure and the materials employed to enhance either the binary or multi-state performance characteristics thereof. For purposes of the instant invention, the terms "memory elements" and "control elements" will be employed synonymously.

The operation of most semiconductor devices is governed by the control of mobile charge carder concentrations different from that generated at thermal equilibrium. Prior to the present invention, only four general methods were known by which to control and modulate the concentration of excess or free (these two terms are used interchangeably throughout this discussion) charge carders in solid state semiconductor devices. These four known methods will be described hereinbelow following a general discussion of those fundamental mechanisms of operation of semiconductor devices which are necessary in order to appreciate the advantages of the instant invention.

By way of explanation, in a perfect semiconductor lattice with no impurities or lattice defects—an intrinsic semiconductor—no charge carriers are present at zero Kelvin since the valence band is filled with electrons and the conduction band is empty. At higher temperatures, however, electron-hole pairs generated as valence band electrons are excited thermally across the band gap to the conduction band. These thermally generated electron-hole pairs are the only charge carders present in an intrinsic semiconductor material. Of course, since the electrons and holes are created in pairs, the conduction band electron concentration (electrons per cubic centimeter) is equal to the concentration of holes in the valence band (holes per cubic centimeter). It is well known, but worth emphasizing, that if a steady state carder concentration is to be maintained, there must be recombination of the charge carriers at the same rate that they are generated. Recombination occurs when an electron in the conduction band makes a transition to an empty state (hole) in the valence band, either directly or indirectly through the agency of a mid-gap recombination center, thus annihilating the pair.

In addition to thermally generated charge carriers, it is possible to create carders in semiconductor materials by purposely introducing certain impurities into the crystal lattice. This process is called doping and represents a common method of varying the conductivity of semiconductors. By doping, a semiconductor material can be altered so that it has a predominance of either electrons or holes, i.e., it is either n-type or p-type. When a crystal lattice is doped such that the equilibrium carder concentrations are different from the intrinsic carder concentrations, the semiconductor material is said to be "extrinsic". When impurities or lattice defects are introduced into an otherwise perfect lattice crystal, additional levels are created in the energy band structure, usually within the band gap. For instance, the introduction of phosphorous in silicon or germanium, generates an energy level very near the conduction band. This new energy level is filled with electrons at zero Kelvin, and very little thermal energy is required to excite these electrons to the conduction band. Thus, at about 50–100 Kelvin, virtually all of the electrons in the impurity level are donated to the conduction band. Semiconductor material doped with donor impurities can have a considerable concentration of electrons in the conduction band, even when the temperature is too low for the intrinsic charge carrier concentration to be appreciable.

Now that the reader can appreciate the significance of the presence of excess charge carriers for electrical conductivity, it must be noted that these carriers can also be created by optical excitation or they can be injected across a forward biased p-n junction or a Schottky barrier. Simply stated and regardless of the manner in which the excess carriers are generated, they can dominate the electrical conduction processes in a semiconductor material. It has previously been stated that there are four known methods of modulating the concentration of free charge. Those four methods are described below:

(1) In 1948, Bardeen, Brattain, and Schockley ushered in the modem era of semiconductor electronics when they demonstrated the operation of a solid state amplifier by successfully modulating the flow of injected minority charge carriers in bipolar junction transistors. The bipolar junction transistor is a three terminal device in which the flow of current through two terminals can be controlled by small changes in the current at the third terminal. This control feature provides for the amplification of small signals or for the switching of the device from an "on" state to an "off" state. In other words, the bipolar transistor is employed to modulate the injection and collection of minority charge carriers across a semiconductor junction. More particularly, and considering, for instance, in a p-n-p bipolar structure (the operation of an n-p-n bipolar structure is simply the reverse of the operation of the p-n-p structure), the negative side of the forward biased junction is the same as the negative side of the reverse biased junction. With this configuration, the injection of holes from the p-n junction into the center n region supplies the minority carriers, holes, to participate in the reverse flow of current through the n-p junction. As should now be evident, the designation of this device as "bipolar" relates to the critical importance of the action of both electrons and holes.

In operation, the reverse saturation current through the p-n junction of the device depends upon the rate at which minority carriers are generated in the neighborhood of the junction. It is possible to increase the reverse current through the junction by increasing the rate of electron-hole pair generation. This can be accomplished with light (as discussed below with respect to photodetectors). Electrically, a convenient hole injection device is a forward biased p-n junction in which the current is due primarily to holes injected from the p region into the n material. If the n side of the forward biased junction is the same as the n side of the reverse biased junction, the resultant p-n-p structure operates when the injection of holes from the p-n junction into the center n region supplies minority carrier holes to participate in the reverse current flow through the n-p junction of the transistor. Of course, the n-region is narrowed so that the injected holes do not recombine in the n region (the base of this p-n-p bipolar transistor) before they can diffuse to the depletion layer of the reverse-biased junction.

Finally, when used as a switch, this type of transistor is usually controlled in two conduction states, referred to as the "on" state and the "off" state. While transistors do not function as a short circuit when turned on and as an open circuit when turned off, they are able to approximate these actions. In transistor switching, the emitter junction is forward biased and the collector is reverse biased, with a reasonable amount of current flowing out of the base. If the base current is switched to zero, the collector current will be negligible. This is the "off" state. However, if the base current is positive and sufficiently large, the device is driven to the saturation regime and the transistor is in its "on" state. Therefore, in the typical switching operation, the base current swings from positive to negative, thereby driving the device from saturation to cutoff and vice versa.

(2) The second conventional method of controlling the concentration of free charge carriers is implemented by metal-oxide-semiconductor field effect transistor (MOSFET) devices. By way of background, one of the most widely employed electronic devices, particularly in digital integrated circuits, is the metal-insulator-semiconductor (MIS) transistor. In an MIS transistor, the concentration of charge carriers in the conduction channel is controlled by a voltage applied at a gate electrode isolated from the channel by an insulator. The resulting device may be referred to generically as an insulated-gate field effect transistor (IGFET). However, since most IGFETs are made using a metal (typically aluminum) for the gate electrode, silicon-dioxide as the insulator, and silicon as the semiconductor material, the term MOS field effect transistor or MOSFET is commonly used.

In operation of a MOSFET, consider an n-type channel formed on a p-type silicon substrate. The n-type source and drain regions are formed by diffusing or implanting dopant atoms into a lightly doped p-type substrate. A thin oxide layer separates the metal gate from the silicon surface. No current flows from the drain to the source unless there is a conducting n-channel between them, since the drain-substrate-source combination includes oppositely directed p-n junctions disposed in series. When a positive voltage is applied to the gate relative to the substrate (the source in this example), positive charge carriers are deposited on the gate metal. As a result of this deposition, negative charge carriers are induced in the underlying silicon by the formation of a depletion region. In addition, a thin surface region containing mobile electrons is formed. The induced electrons form the channel of the FET and allow current to flow from the drain to the source. The effect of the gate voltage is to vary the conductance of the induced channel for low drain-to-source voltage. The MOS field effect transistor is particularly useful in digital circuits, in which it is switched from the "off" state (no conducting channel) to the "on" state. Both n-channel and p-channel MOS transistors are in very common usage.

The MOS structure can be thought of as a capacitor in which one plate is a semiconductor. If a negative voltage is applied between the metal and the semiconductor, a negative charge is effectively deposited on the metal. In response thereto, an equal net positive charge is accumulated at the surface of the semiconductor. In the case of a p-type substrate, this occurs by hole accumulation at the semiconductor-oxide interface. Since the applied negative voltage depresses the electrostatic potential of the metal relative to the semiconductor, the electron energies are raised in the metal relative to the semiconductor. The energy bands of the semiconductor bend near the interface to accommodate the accumulation of holes. Because no current passes through the MOS structure, there is no variation in the Fermi level position within the bulk of the semiconductor. The result is a bending of the semiconductor bands near the interface so that the Fermi level is closer to the valence band adjacent the interface, thereby indicating a larger hole concentration than that arising from the doping of the p-type semiconductor material.

When a positive voltage is applied from the metal to the semiconductor, the potential of the metal increases, thereby lowering the metal Fermi level relative to its equilibrium position. As a result, the oxide conduction band is again tilted. The positive voltage deposits positive charge on the metal and effectively calls for a corresponding net negative charge at the surface of the semiconductor. Such a negative charge in p-type material arises from depletion of holes from the region near the surface which leaves behind uncompensated ionized acceptors. In the depleted region, the hole concentration decreases, bending the bands down near the semiconductor surface. If the positive charge continues to increase, the bands at the semiconductor surface bend down still further. In fact, a sufficiently large voltage can cause a large electron concentration in the conduction band. The region near the semiconductor in this case has conduction properties typical of n-type material. This n-type surface layer is formed not by doping, but by "inversion" of what was originally p-type semiconductor material due to the applied voltage. This inverted layer, separated from the underlying p-type material by a depletion region, is the key to MOS transistor operation.

(3) The third known method of controlling the concentration of free charge carriers is by the photogeneration of free charge carriers of both polarities. This photogeneration of free charge carriers takes place in such state-of-the-art devices as photovoltaic cells, photoresistors, photodetectors and electrophotographic drums.

In general, when excess electrons or holes are created in a semiconductor material, there is a corresponding increase in the electrical conductivity of the material. In the event that the excess charge carriers are generated from optical excitation, the resulting increase in conductivity is called "photoconductivity". When photons are directed to impinge upon a semiconductor material, those photons having energies greater than the band gap energy are absorbed and electron hole pairs generated. The electron and hole created by this absorption process are excess carriers; since they are out of balance with their environment and exist in their respective bands, they contribute to the electrical conductivity of the material.

(4) The fourth known method of modulating the free charge carrier concentration in semiconductor materials is by controlling the physical structure of chalcogenide phase change materials as they undergo reversible amorphous to crystalline phase transformations. A detailed explanation of this phenomena was reported in the early work on optical and electrical Ovonic phase change materials pioneered by S. R. Ovshinsky at Energy Conversion Devices, Inc. These materials and technology are discussed in detail below.

Since the present invention has significant scientific applicability to and immediate commercial impact on many different segments of the electronic and semiconductor industries, said invention is discussed hereinbelow in three different, but related sub-sections. More particularly, the relevance of the instant invention is discussed with respect to: (A) semiconductor devices per se; (B) optically operable, fast, non-volatile phase change memories; and (C) electrically erasable, directly overwritable, multilevel single-cell memories.

EARLY ELECTRICAL PHASE CHANGE MEMORY

The general concept of utilizing electrically writable and erasable phase change materials (i.e., materials which can be electrically switched between generally amorphous and generally crystalline states) for electronic memory applications is well known in the an and as is disclosed, for example, in U.S. Pat. No. 3,271,591 to Ovshinsky, issued Sep. 6, 1966 and in U.S. Pat. No. 3,530,441 to Ovshinsky, issued Sep. 22, 1970, both of which are assigned to the same assignee as the present invention, and both disclosures of which are incorporated herein by reference (hereinafter the "Ovshinsky patents").

As disclosed in the Ovshinsky patents, such phase change materials can be electrically switched between structural states of generally amorphous and generally crystalline local order or between different detectable states of local order across the entire spectrum between completely amorphous and completely crystalline states. That is, the Ovshinsky patents describe that the electrical switching of such materials is not required to take place between completely amorphous and completely crystalline states but rather can be in incremental steps reflecting changes of local order to provide a "gray scale" represented by a multiplicity of conditions of local order spanning the spectrum between the completely amorphous and the completely crystalline states. The early materials described by the Ovshinsky patents could also be switched between only two structural states of generally amorphous and generally crystalline local order to accommodate the storage and retrieval of single bits of encoded binary information.

The electrically erasable phase change memories described in the Ovshinsky patents were utilized in a number of commercially significant applications. However, due to the lack of funding necessary for commercialization, subsequent developments in other fields of solid state electronic memories eventually displaced these early electrically erasable phase change technology in the marketplace and prevented these memories from being used in electrical devices such as, for instance, personal computers.

In the typical personal computer there often are four tiers of memory. Archival information is stored in inexpensive, slow, high storage capacity, non-volatile devices such as magnetic tape and floppy disks. This information is transferred, as needed, to faster and more expensive, but still non-volatile, hard disk memories. Information from the hard disks is transferred, in turn, to the still more expensive, faster, volatile system memory which uses semiconductor dynamic RAM (DRAM) devices. Very fast computers even transfer forth and back small portions of the information stored in DRAM to even faster and even more expensive volatile static RAM (SRAM) devices so that the microprocessor will not be slowed down by the time required to fetch data from the relatively slower DRAM. Transfer of information among the tiers of the memory hierarchy occupies some of the computer's power and this need for "overhead" reduces performance and results in additional complexity in the computer's architecture. The current use of the hierarchal structure, however, is dictated by the price and performance of available memory devices and the need to optimize computer performance while minimizing cost.

The electrically erasable phase change memories described in the Ovshinsky patents, as well as subsequent electrical solid state memory, had a number of limitations that prevented their widespread use as a direct and universal replacement for present computer memory applications, such as tape, floppy disks, magnetic or optical hard disk drives, solid state disk flash, DRAM, SRAM, and socket flash memory. Specifically, the following represent the most significant of these limitations: (i) a relatively slow (by present standards) electrical switching speed, particularly when switched in the direction of greater local order (in the direction of increasing crystallization); (ii) a relatively high input energy requirement necessary to initiate a detectable change in local order; and (iii) a relatively high cost per megabyte of stored information (particularly in comparison to present hard disk drive media).

The most significant of these limitations is the relatively high energy input required to obtain detectable changes in the chemical and/or electronic bonding configurations of the chalcogenide material in order to initiate a detectable change in local order. Also significant were the switching times of the electrical memory materials described in the Ovshinsky patents. These materials typically required times in the range of a few milliseconds for the set time (the time required to switch the material from the amorphous to the crystalline state); and approximately a microsecond for the reset time (the time required to switch the material from the crystalline back to the amorphous state). The electrical energy required to switch these materials typically measured in the range of about a microjoule.

It should be noted that this amount of energy must be delivered to each of the memory elements in the solid state matrix of rows and columns of memory cells. Such high energy levels translate into high current carrying requirements for the address lines and for the cell isolation/address device associated with each discrete memory element. Taking into consideration these energy requirements, the choices of memory cell isolation elements for one skilled in the an would be limited to very large single crystal diode or transistor isolation devices, which would make the use of micron scale lithography and hence a high packing density of memory elements impossible. Thus, the low bit densities of matrix arrays made from this material would result in a high cost per megabyte of stored information.

By effectively narrowing the distinction in price and performance between archival, nonvolatile mass memory and fast, volatile system memory, the memory elements of the present invention have the capability of allowing for the creation of a novel, non-hierarchal "universal memory system". Essentially all of the memory in the system can be low cost, archival and fast. As compared to original Ovshinsky-type phase change electrical memories, the memory materials described herein provide over six orders of magnitude faster programming time (less than 30 nanoseconds) and use extremely low programming energy (less than 0.1 to 2 nanojoules) with demonstrated long term stability and cyclability (in excess of 1 billion cycles). Also, experimental results indicate that additional reductions in element size can increase switching speeds and cycle life.

In general, development and optimization of the class of chalcogenide memory materials has not proceeded at the same rate as other types of solid state electrical memories that now have substantially faster switching times and substantially lower set and reset energies. These other forms of memories typically employ several solid state microelectronic circuit elements for each memory bit (as many as three or four transistors per bit) in some memory applications. The primary "non-volatile" memory elements in such solid state memories, such as EEPROM, are typically floating gate field effect transistor devices which have limited re-programmability and which hold a charge on the gate of a field effect transistor to store each memory bit. Since this charge can leak off with the passage of time, the storage of information is not truly non-volatile as it is in the phase change media of the prior an where information is stored through changes in the actual atomic configuration or electronic structure of the chalcogenide material from which the elements are fabricated. These other forms of memories now enjoy some limited acceptance in the marketplace.

In contrast to DRAM and SRAM volatile memory devices and unlike other "flash" devices, such as floating gate structures, no field effect transistor devices are required in the electrical memory devices of the present invention. In fact the electrically erasable, directly overwritable memory elements of the present invention represent the simplest electrical memory device to fabricate, comprising only two electrical contacts to a monolithic body of thin film chalcogenide material and a semiconductor diode for isolation. As a result, very little chip "real estate" is required to store a bit of information, thereby providing for inherently high density memory chips. Further, and as described below, additional increases in information density can be accomplished through the use of multibit storage in each discrete memory cell.

The solid state, electronic memories presently in use are relatively expensive to manufacture, the cost being typically about twenty times the cost per bit of storage capacity in relation to magnetic disk storage. On the other hand, these solid state, electronic memories provide certain advantages over magnetic disk memories in that they have no moving pans, require less electrical energy to operate, are easy to transport and store, and are more versatile and adaptable for use with portable computers and other portable electronic devices. As a matter of fact, hard drive manufacturers are forecasting rapid growth in the use of ever smaller hard drives and eventually solid state memory storage in the portable computer field. In addition, these solid state memories are usually true random access systems as opposed to disk types which require physical movement of the disk head to the proper data track for accessing the desired memory location. However, in spite of such advantages, the higher cost of solid state electrically erasable memories have prevented them from enjoying a substantial share of the market now dominated by magnetic memory systems. Although solid state electrically erasable memories could potentially be manufactured at reduced cost, the overall performance parameters of these materials are inadequate for them to fully replace magnetic disk systems.

We previously mentioned that there were only four known types of semiconductor devices which could be employed to modulate the concentration of free charge. Each of those devices were-then discussed in some detail. A fifth semiconductor device which can be set to a plurality of different resistance values by relatively low energy pulses and which is capable of relatively fast switching characteristics will now be discussed in detail. After carefully perusing the following paragraphs describing the performance characteristics and the physics behind the operation of the device, the reader will understand why it was not categorized as a fifth type of charge concentration modulating semiconductor device.

A recently developed memory device is the metal-amorphous silicon-metal (MSM) electrical memory switch. See Rose, et al, "Amorphous Silicon Analogue Memory Devices", *Journal of Non-Crystalline Solids,* 115 (1989), pp.168–70 and Hajto, et al, "Quantized Electron Transport in Amorphous -Silicon Memory Structures", *Physical Review Letters,* Vol. 66, No. 14, Apr. 8, 1991, pp. 1918–21. This MSM switch is fabricated by the deposition of specifically selected metallic contacts on either side of a p-type amorphous silicon (a-Si) thin film. The importance of the selection of the metallic contact materials will be discussed later. MSM memory switches are disclosed as exhibiting relatively fast (10–100 ns) analogue switching behavior for voltage pulses of from 1 . 5 volts, thereby providing a range of resistances of from about $10^3$ to about $10^6$ ohms to which they can be set in a non-volatile manner. As should be readily apparent to skilled practitioners in the art, the MSM memory switches of Rose, et al and Hajto, et al, although exhibiting electrical switching characteristics (i.e., times, energies and resultant device resistance) similar to the electrical switching characteristics of the memory elements of the instant invention, there are actually significant operational differences therebetween.

The most significant electrical switching difference resides in the inability of the MSM memory switches to be directly overwritten. That is, the MSM switches cannot be modulated directly bidirectionally from any one resistance in the analogue range of resistances to any other resistance in that range without first being erased (set to a specific starting resistance or "starting state"). More specifically, the MSM switch must first be set to the high resistance state (erased) before said switch can be set to another resistance value within the analogue range. In contrast thereto, the memory elements of the instant invention do not require erasure before being set to another resistance in the range; i.e., they are directly overwritable.

Another significant difference in the electrical switching characteristics which exists between the MSM memory switches of Rose, et al and Hajto, et al and the electrical memory elements of the present invention is the bipolar behavior of the said switches. As is disclosed by Rose, et al, the MSM switches must be erased using electrical pulses of reverse polarity from those pulses used to write. Significantly, this reversal of polarity of the applied pulse is not required by the memory elements of the present invention, whether the instant memory elements are used for digital or analogue switching.

These differences in electrical switching characteristics between the MSM switches and the memory elements of the present invention are attributable to more than just a mere difference in material from which the elements are constructed. These differences are indicative of the fundamental differences in switching mechanisms which characterize the physics of operation of the two devices. As alluded to above and as disclosed in the aforementioned articles, the electrical switching characteristics of the MSM memory switches are critically dependent upon the particular metal(s) from which the contacts are fabricated. This is because these MSM switches require a very highly energetic "forming" process in which metal from at least one of the contacts is transported into and formed as an integral portion of the switch body. In this process, a plurality (at least 15 from FIG. 1 of the Rose, et al paper) of progressively increasing 300 nanosecond, 5–15 volt pulses are employed to form the switch. Rose, et al state: ". . . X-ray microanalysis studies of the devices have been carded out, and the top electrode material has been found embedded in a filamentary region of the a-Si. This suggests that the top metal becomes distributed in the filament, and may play a role in the mechanism of switching . . . " Rose, et al also specifically find that the dynamic range of the available resistances is determined by the metal from which the upper electrode contact is fabricated. As is stated by Rose, et al: . . . it is found that its value is entierly (sic) dependent on the top contact, and completely independent of the bottom metallisation (sic), i.e. Cr top electrode devices are always digital and V top electrode devices are always analogue irrespective of the bottom electrode . . . "

It is within this metallic filamentary region where the electrical switching occurs; and without this mass migration of metal into the a-Si, there would be no switching, see the Hajto, et al paper. In complete contradistinction thereto, the memory elements of the present invention do not require migration of the contact material into the thin-film memory element to achieve high speed, low energy, analogue, direct overwrite, memory switching. As a matter of fact, in the fabrication of the memory elements of the instant invention, great care is taken to prevent the diffusion of the metal from either of the electrodes into the active chalcogenide material. In one embodiment of the device described in the instant invention, the electrodes are each fabricated as a bilayered structure in which, for instance, carbon forms a thin film barrier to prevent migration or diffusion of, for instance, molybdenum into the chalcogenide switching material.

From the foregoing analysis of Rose, et al and Hajto, et al, it should be clear that MSM memory switches do not, by any stretch of the imagination qualify as a modulator of free charge concentration. Rather, MSM memory switches simply rely upon the creation of a filamentary metallic pathway through the amorphous silicon material in order to obtain a range of resistivities in much the same way as a modulated switch is used to control the flow of electrical current. A percolation pathway is established the diameter of which can be increased or decreased to change the resistivity thereof. No movement of Fermi level position is involved in the switching process. No change in activation of the semiconductor material need be invoked to explain the operation. No atomic scale movement of lone pairs of non-bonding electrons is present. Crystallite size and surface to volume ratio thereof is not important. But most importantly, it is impossible for Rose, et al and Hajto, et al to directly overwrite information stored in the cells of their memory material. The MSM switch requires stored information to be erased before new information can be written. It is not surprising that Rose, et al have asserted that their MSM switch is limited to one million cycles while the memory elements of the instant invention were cycled over 1 billion cycles without failure prior to ending the test.

Simply stated, no solid state memory system developed prior to the present invention, regardless of the materials from which it was fabricated, has been inexpensive; easily manufacturable; non-volatile; electrically writable and directly erasable (overwritable) using low input energies; capable of multibit storage in a single cell (had a gray scale); and capable of very high packing density. The memory system described hereinbelow, because it addresses all of the deficiencies of known memory systems, will find immediate widespread use as a universal replacement for virtually all types of computer memory currently in the marketplace. Further, because the memories of the present invention can be fabricated in an all thin-film format, three-dimensional arrays are possible for high speed, high density neural network, and artificial intelligence applications. The memory system of the present invention is therefore uniquely applicable to neural networks and artificial intelligence systems because its multi-layer, three-dimensional arrays provide massive amounts of information storage that is rapidly addressable, thus permitting learning from stored information.

It is clear from the discussion above that the quantitative changes in switching speed and energy requirements of the memories of the present invention, as compared to the phase change memories of the prior art, demonstrate that those memories define an entirely new class of modulatable semiconductor material. In addition, the prior art has no analog to the direct overwrite, wide dynamic range and multibit storage capabilities of the instant memory elements.

As should be abundantly clear to ordinarily skilled artisans, in order to address the flash EEPROM market and be seriously considered as a universal memory, it is essential that memory elements be truly non-volatile. This is even more significant if the memory element is claimed to possess multibit storage capabilities. If a set resistance value is lost or even found to significantly drift over time, the information storm therein is destroyed, users lose confidence in the archival capabilities of the memory and the technology loses all credibility. In addition to set resistance stability, another highly important factor which would be required of a universal memory is low switching current. This is extremely significant when the EEPROMs are used for large scale archival storage. Used in this manner, the EEPROMs would replace the mechanical hard drives (such as magnetic or optical hard drives) of present computer systems. One of the main reasons for this replacement of conventional mechanical hard drives with EEPROM "hard drives" would be to reduce the comparatively large power consumption of the mechanical systems. In the case of lap-top computers, this is of particular interest because the mechanical hard disk drive is one of the largest power consumers therein. Therefore, it would be especially advantageous to reduce this power load, thereby substantially increasing the usage time of the computer per charge of the power cells. However, if the EEPROM replacement for mechanical hard drives has high switching current requirements (and therefore high power requirements), the power savings may be inconsequential or at best unsubstantial. Therefore, any EEPROM which is to be considered a universal memory requires low switching current.

Yet another requirement of a EEPROM universal memory is high thermal stability of the information stored therein. Today's computers, especially personal computers, are routinely subjected to high temperatures. These high temperatures can be caused by internally created heat such as from power sources or other heat producing internal components. These high temperatures may also be caused by environmental factors, such as use of the computer in a hot climate or storage of the computer in an environment which is directly or indirectly heated to higher than normal temperatures. Whatever the cause of the elevated temperatures, present computer memory systems, especially "hard" or archival memory, must be thermally stable even at relatively high temperatures. Without this thermal stability data loss may occur leading to the aforementioned loss of credibility.

Still another requirement of a EEPROM universal memory is long write/erase cycle life. For EEPROMS, as is the case with all archival memory, cycle life plays an important role in consumer confidence and acceptance. If the cycle life of a memory device is too short, the consumer will be adverse to using this device for fear of losing valuable data. If the EEPROM is to be used as a replacement for computers main memory or display memory, that is, as a replacement for DRAM or SRAM, the requirement of long cycle life is even more critical. The main and display memory are a computer's most often written to/erased data storage area. Every time a new computer program is loaded, a portion of the computer's main memory is erased and rewritten. During the execution of a computer program, a portion of the computer's main memory is constantly being cycled. Every time the computer monitor's display is changed, portions of the display memory are cycled. If the EEPROMs used to replace the computer's main and display memory do not have a relatively long write/erase cycle life, these memories would need to be replaced excessively. This would lead to excessive costs to the consumer and therefore loss of consumer confidence.

SUMMARY OF THE INVENTION

There is disclosed herein fundamentally new solid state, directly overwritable, electronic, non-volatile, high density, low cost, readily manufacturable, single cell memory elements having reduced switching current requirements and greater thermal stability data stored therein. These memory elements utilize a unique class of chalcogenide memory materials which exhibit orders of magnitude higher switching speeds at remarkably reduced energy levels. The novel memory materials, of which the memory elements and arrays of the instant invention are formed, are characterized, inter alia, by stable and truly non-volatile detectable configurations of local atomic and/or electronic order which can be selectively and repeatably established by electrical input signals of varying pulse voltage, current and duration. The memory devices of the instant invention are therefore switchable between atomic and/or electronic configurations of different local order so as to provide at least two stable settings. The orders of magnitude of improvement in switching speeds and in switching energies made possible by the memory elements disclosed herein is not merely incremental in nature, but rather represents a fundamental improvement beyond what was previously thought possible.

While theories on the memory materials described herein are presently being investigated, no theory as yet proposed explains all of the extraordinary electrical switching behavior observed. Specifically, the subject semiconductor materials can be switched between numerous electrically detectable conditions in nanosecond time periods with the input of picojoules of energy. The subject memory materials are truly non-volatile and can be cycled (written and rewritten) almost indefinitely while maintaining the integrity of the information stored by the memory cell without the need for periodic refresh signals. The subject memory material is directly overwritable so that information stored in other memory elements need not be erased (as is required with ferroelectric and other flash storage systems) in order to change information stored in a given set of memory elements.

One embodiment of the present invention comprises an electrically operated, directly overwritable, multibit, single-cell memory element. The memory element includes a volume of memory material which defines the single cell memory element. The memory material is characterized by: (1) a large dynamic range of electrical resistance values; and (2) the ability to be set at one of a plurality of resistance values within said dynamic range in response to selected electrical input signals so as to provide said single cell with multibit storage capabilities. The memory element also includes a pair of spacedly disposed contacts for supplying the electrical input signal to set the memory material to a selected resistance value within the dynamic range. At least a filamentary portion of the single cell memory element being setable, by the selected electrical signal to any resistance value in said dynamic range, regardless of the previous resistance value of said material. The memory element further includes a filamentary portion controlling means disposed between the volume of memory material and at least one of the spacedly disposed contacts. The controlling means defining the size and position of the filamentary portion during electrical formation of the memory element and limiting the size and confining the location of the filamentary portion during use of the memory element, thereby providing for a high current density within the filamentary portion of the single cell memory element upon input of a very low total current electrical signal to the spacedly disposed contacts. The controlling means is a layer of silicon nitride.

Preferably, the filamentary portion controlling means comprises a thin film layer of silicon nitride which is between 10 and 100 Angstroms thick, and is disposed between one of the spacedly disposed contacts and the volume of memory material.

More preferably, the filamentary portion controlling means comprises a thin film layer of highly resistive silicon nitride material containing at least one low resistance pathway thereacross, through which input electrical signals pass between the spacedly disposed contact and the volume of memory material. In one embodiment, the highly resistive material preferably is formed of Si, N and H and is most preferably formed of a material having a composition of, in atomic percent, between about 30–40% silicon, 40–50% nitrogen and up to 30% H.

Other embodiments and features of the present invention as well as other advantages and objects thereof will be set forth and become apparent from the derailed description of the invention which follows hereinafter, especially when taken in combination with the accompanying drawings.

DETAILED DESCRIPTION OF THE INVENTION

Figure 1:
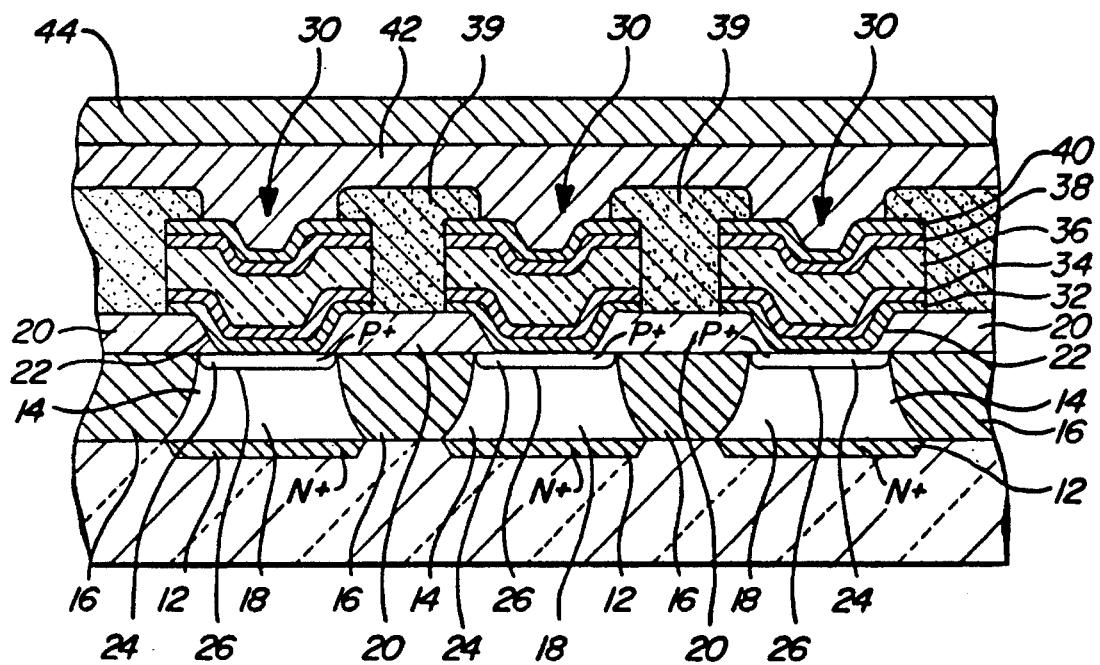
FIG. 1 is a fragmentary cross-sectional view illustrating a portion of an integrated circuit, said circuit depicting an electrically erasable and directly overwritable multilevel memory configuration of a first preferred embodiment of the present invention.

Erasable electrical memories fabricated from the broad class of chalcogenide materials have employed structural changes that were accommodated by movement of certain atomic species within the material to permit change of phase as the material switched from the amorphous state to the crystalline state. For example, in the case of electrically switchable chalcogenide alloys formed of tellurium and germanium, such as those comprising about 80% to 85% tellurium and about 15% germanium along with certain other elements in small quantities of about one to two percent each, such as sulfur and arsenic, the more ordered or crystalline state was typically characterized by the formation of a highly electrically conductive crystalline Te filament within the switchable pore of the memory material. A typical composition of such a prior art material would be, for example, $Te_{81}Ge_{15}S_2As_2$ or $Te_{81}Ge_{15}S_2Sb_2$. Because Te is so highly conductive in its crystalline state, a very low resistance condition was established through the Te filament in the more ordered or crystalline state; this resistance being a number of orders of magnitude lower than the resistance of the pore in the less ordered or amorphous state.

However, the formation of the conductive Te filament in the crystalline state required migration of the Te atoms from their atomic configuration in the amorphous state to the new locally concentrated atomic configuration in the crystalline Te filament state. Similarly, when the chalcogenide filamentary material was switched back to the amorphous state, the Te which had precipitated out into the crystalline filament was required to migrate within the material from its locally concentrated form in the filament back to its atomic configuration in the amorphous state. This atomic migration, diffusion or rearrangement between the amorphous and crystalline states required in each case a holding or dwell time of sufficient length to accommodate the migration, thereby making the requisite switching time and energy relatively high.

The subject inventors have discovered a remarkable reduction in both the required switching time and the energy input for a fundamentally different type of electrically erasable, directly overwritable memory based up on a new class of chalcogenide semiconductor materials. Moreover, the chalcogenide materials are based on fundamentally new physics, the operation of which, although not fully understood, provides for switching either within a wide dynamic range of stable states with remarkably low energy inputs at remarkably fast speeds so that this newly discovered class of materials can be used to fabricate improved electrical memory elements.

Specifically, the memory material can be switched between electrically detectable conditions of varying resistance in nanosecond time periods (the minimum switching speed and minimum energy requirements have not as yet been ascertained, however, experimental data as of the filing of this application have shown that the electrical memory can be modulated (even though not optimized) with as short as 1 nanosecond programming pulses) with the input of picojoules of energy. This memory material is non-volatile and will maintain the integrity of the information stored by the memory cell (within a selected margin of error) without the need for periodic refresh signals. In contrast to many other semiconductor materials and systems heretofore specified for memory applications, the semiconductor memory material and systems of the present invention are directly overwritable so that the discrete memory elements need not be erased (set to a specified starting point) in order to change information stored there. The remarkably fast and low energy switching to any of the different values of resistance can be attributed to the fact that said switching occurs without the need for gross atomic rearrangement of the switching material.

The memory material is formed from a plurality of constituent atomic elements, each of which is present throughout the entire volume of memory material. The plurality of constituent atomic elements preferably includes at least one chalcogen element and may include at least one transition metal element. The term "transition metal" as used herein includes elements 21 to 30, 39 to 48, 57 and 72 to 80. More preferably, the plurality of constituent atomic elements which form the volume of memory material includes elements selected from the group consisting of Te, Se, Ge, Sb, Bi, Pb, Sn, As, S, Si, P, O and mixtures or alloys thereof. More preferably the transition metal includes Cr, Fe, Ni and mixtures of alloys thereof and the chalcogen element includes Te and Se. Most preferably the transition metal is Ni. Specific examples of such multielement systems are set forth hereinafter with respect to the Te:Ge:Sb system with or without Ni and/or Se.

As is well known to those skilled in the art, chalcogenide semiconductor materials, like other semiconductors, are characterized by a forbidden energy zone or band gap separating their conduction and valence bands (see the "Cohen, Fritzsche, Ovshinsky model" describing the mobility gap of chalcogenide semiconductor materials). The Fermi level position, i.e., the energy at which the probability of occupancy of an energy level is 50%, determines, in part, the electrical conductivity of the semiconductor material and, as it is moved to substantially different positions in the band gap, a large dynamic range of electrical conductivities become possible. However, previously hypothesized theories can neither explain the very low energy requirements needed to change the position of the Fermi level and thereby set the memory elements at a given resistance value nor can they explain the types of results presented graphically below, particularly the remarkable ability to move to intermediate values of resistance in both directions (from values of lesser resistance to values of greater resistance upon the input of a given electrical signal as well as visa versa) without returning to the aforementioned initial "starting state" which requires operation only in a single direction of movement (from values of higher resistance to values of lower resistance). That is why we state that the semiconductor material of the instant invention is truly directly overwritable. Regardless of the explanation of the manner in which this is accomplished, the present invention provides a combination of valuable electrical switching characteristics never before available in a single memory element.

A fundamental rule distinguishing noncrystalline solids from their crystalline counterparts is that the constituent atoms of the non-crystalline phases have bonding options. This is the sine qua non of noncrystalline solids. It results from the fact that crystalline symmetry prescribes the lattice which, in turn, restricts chemical bonding choices. All of the properties possessed by an amorphous solid; its cohesive energy, its resistance to crystallization, its optical band gap, its mobility gap, its density of electronic states, etc., depend upon three factors; its short range bonding relationships, its varied topological configurations, and its total interactive environment. An amorphous material, however, can be a nonstoichiometric alloy in a nonequillibrium configuration, consisting of many different types of atoms, providing a variety of local order and environments. The crystallites from which a large volume fraction of the semiconductor material of the instant invention is composed, are very small, on the order of (by way of example) 500 Angstroms in major dimension. These crystallites are surrounded by a skin or surface region of structurally disordered material which may only be a few atomic monolayers thick. Therefore, an amorphous model or at least a model characterized by only short range local order, can best be employed to attempt to predict the molecular and atomic interactions in the surface region. Without wishing to be bound thereby, such a descriptive model will be described in the following paragraphs.

The specific semiconductor alloys employed in fabricating the memory devices include chalcogenide elements which are particularly noted for the presence of "lone pair" electrons. It is therefore necessary to discuss the effect of those lone pair electrons in available chemical bonding configurations. Simply stated, a lone pair is a pair of electrons in the valence shell of an atom that is typically not engaged in bonding. Such lone pair electrons are important both structurally and chemically. They influence the shape of molecules and crystalline lattice structures by exerting strong repulsive forces on neighboring electron pairs which are engaged in bonding configurations and as well as on other lone pairs. Since lone pair electrons are not tied down into a bonding region by a second nucleus, they are able to influence and contribute to low energy electronic transitions. As first pointed out by Ovshinsky, the lone pairs can have 1 and 3 center bonding; and as demonstrated by Kastner, Adler and Fritsche, they have valance alternation pairs.

Specifically, the tellurium alloys described herein have a valence band made up of lone pair states. Since four (4) p shell electrons are present in Te, and the Te atom is chemically bonded by two of these bonding electrons in the p shell, the other two outer electrons (the lone pair) are not utilized for bonding purposes and hence do not substantially change the atomic energy of the system. In this regard, note that the highest filled molecular orbital is the orbital which contains the lone pair electrons. This is significant because, in a perfect stoichiometric crystal of tellurium and germanium atoms, upon the application of some internal strain in the lattice from which the crystallite is formed, the valence band can broaden and move upward toward the position of the then existing Fermi level. However, TeGe crystals are naturally "self-compensated", that is, the crystal desires to preferentially assume a Te rich (52 percent Te and 48 percent Ge) composition. The stoichiometric crystal is a face centered cube; however, with the addition of a minimal amount of energy, the crystal can assume a rhombohedral lattice structure by increasing the number of its Ge and/or Sb vacancies. It is this creation of vacancies in the crystalline lattice structure, which can reduce lattice strain in TeGe alloys, is responsible for lowering the energy state of the material and moves the Fermi level toward the valence band.

It is acceptable, if not essential to superimpose an amorphous model of local order on top of a short range local order model for the purpose of obtaining a descriptive, if not perfectly predictive explanation of atomic behavior. When considering the amorphous nature of the material, note that the density of defect states in the band mils is greatest adjacent the band edges, while the depth of the recombination centers for captured charge carriers are deeper farther away from the band edges. The presence of these deep traps and tall states would provide a possible explanation for intermediate stable resistance values between the Fermi level position and the band edge. Regardless of theory, when fully crystalline, the semiconductor material of the instant invention is a degenerate semiconductor which exhibits metallic-like conduction.

It is further believed that the size of the crystallites which exist in the bulk of the semiconductor and memory material is relatively small, preferably less than about 2000 Å, more preferably between about 50 and 500 Å, and most preferably on the order of about 200 to about 400 Å. Further, these crystallites are believed to be surrounded by an amorphous skin which may contribute to the rapid formation of the many Fermi level positions of the material, detectable as different resistances (conductivities), as well as to the lower energy requirements for the transitions between these detectable resistance values to which the material can be reliably and repeatably set.

In accordance with still another aspect of the present invention, it has been found that modulation of the switching characteristics of two or three terminal semiconductor devices fabricated from the microcrystalline materials of the present invention may be controlled such that repeatable and detectable resistance values can be effected. It has been found that, in order for the materials of the present invention to be quickly set by low energy input signals to a desired conductivity (determined by the Fermi level position), it is only necessary that said materials are capable of stable (or long lived metastable) existence with a at least two different Fermi level positions, which Fermi level positions are characterized by substantially constant band gaps but different electrical conductivities. As noted above, it is also believed that the relatively small crystallite size may contribute to the rapid transition between detectable values of resistance.

One characteristic of the semiconductor materials of the present invention is their tendency toward the formation of more and smaller crystallites per unit volume. Crystallite sizes of the widest preferential range of representative materials embodying the present invention have been found to be far less than about 2000 Å, and generally less than the range of about 2,000 Å to 5,000 Å which was characteristic of prior an materials. Crystallite size is defined herein as the diameter of the crystallites, or of their "characteristic dimension" which is equivalent to the diameter where the crystallites are not spherically shaped.

It has been determined that compositions in the highly resistive state of the class of TeGeSb materials which meet the criteria of the present invention are generally characterized by substantially reduced concentrations of Te relative to that present in prior an electrically erasable memory materials. In one composition that provides substantially improved electrical switching performance characteristics, the average concentration of Te in the as deposited materials was well below 70%, typically below about 60% and ranged in general from as low as about 23% up to about 58% Te and most preferably about 48% to 58% Te. Concentrations of Ge were above about 5% and ranged from a low of about 8% to about 40% average in the material, remaining generally below 50%. The remainder of the principal constituent elements in this composition was Sb. The percentages given are atomic percentages which total 100% of the atoms of the constituent elements. Thus, this composition may be characterized as $Te_aGe_bSb_{100-(a+b)}$. These ternary Te—Ge—Sb alloys are useful starting materials for the development of additional memory materials having even better electrical characteristics.

Figure 6:
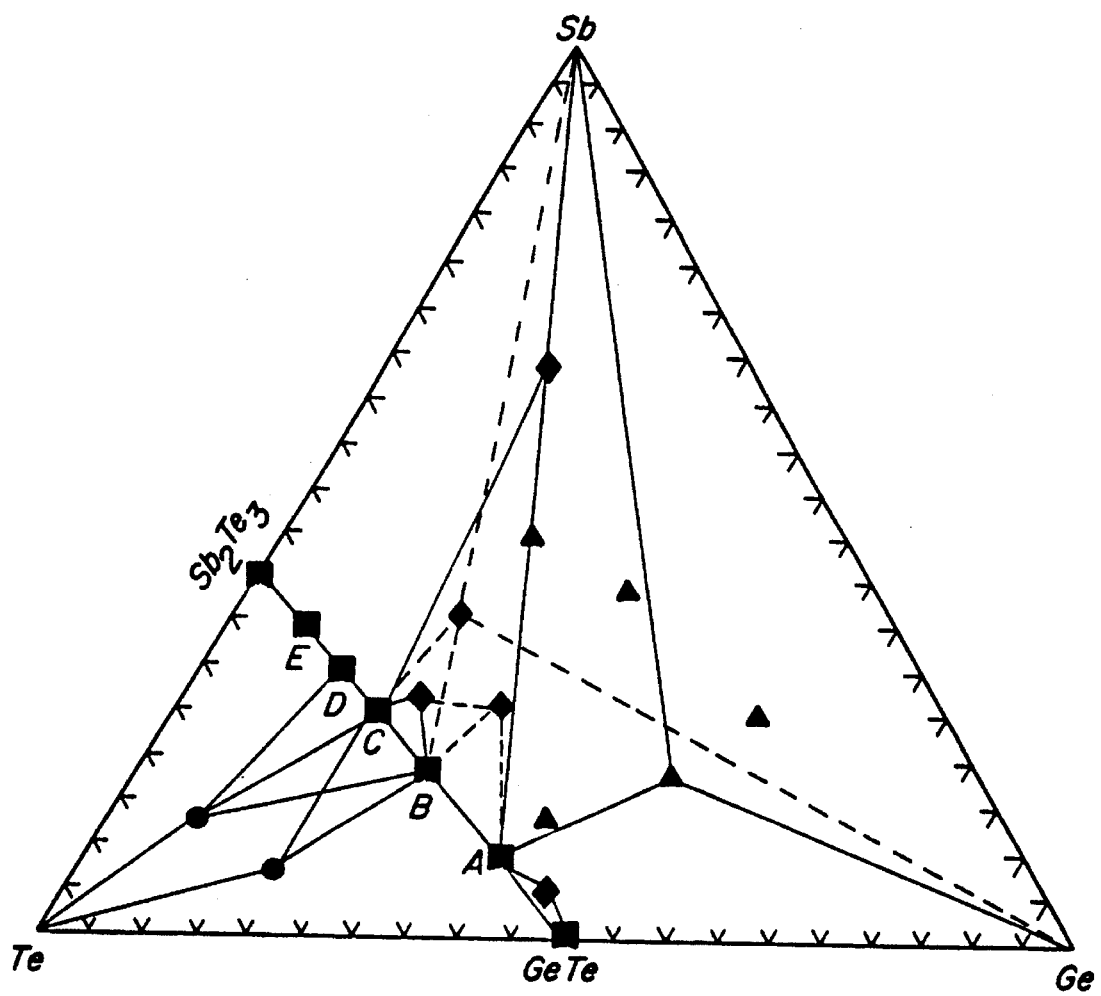
FIG. 6 is a ternary phase diagram of the Ge:Sb:Te alloy system from which the memory elements of the instant invention are fabricated, said phase diagram showing the multiple phases into which various mixtures of these elements segregate upon rapid solidification.

A ternary diagram of the Te:Ge:Sb system is shown in FIG. 6. Melts were prepared from various mixtures of Te, Ge and Sb, the melts segregated into multiple phases upon rapid solidification. Analysis of these rapidly solidified melts indicated the presence of ten different phases (not all present in any one rapidly solidified melt). These phases are: elemental Ge, Te and Sb, the binary compounds GeTe, and $Sb_2Te_3$ and five different ternary phases. The elemental compositions of all of the ternary phases lie on the pseudo-binary GeTe—$Sb_2Te_3$ line and are indicated by the reference letters A, B, C, D and E on the ternary diagram shown in FIG. 6. The atomic ratios of the elements in theses five ternary phases are set forth in Table 1. A more detailed description of FIG. 6 is presented hereinbelow.

TABLE I

| Observed Ternary Crystalline Phases of the TeGeSb System | | | |
| --- | --- | --- | --- |
| Designation | At % Ge | At % Sb | At % Te |
| A | 40 | 10 | 50 |
| B | 26 | 18 | 56 |
| C | 18 | 26 | 56 |
| D | 14 | 29 | 57 |
| E | 8 | 35 | 56 |

The novel memory elements of the present invention include a volume of memory material, said memory material preferably including at least one chalcogen and can include one or more transition metals. The memory materials which include transition metals are elementally modified forms of our memory materials in the Te—Ge—Sb ternary system. That is, the elementally modified memory materials constitute modified forms of the Te—Ge—Sb memory alloys. This elemental modification is achieved by the incorporation of transition metals into the basic Te—Ge—Sb ternary system, with or without an additional chalcogen element, such as Se. Generally the elementally modified memory materials fall into two categories.

First is a memory material which includes Te, Ge, Sb and a transition metal, in the ratio $(Te_aGe_bSb_{100-(a+b)})_cTM_{100-c}$ where the subscripts are in atomic percentages which total 100% of the constituent elements, wherein TM is one or more transition metals, a and b are as set forth herein above for the basic Te—Ge—Sb ternary system and c is between about 90 and about 99.5%. The transition metal can preferably include Cr, Fe, Ni and mixtures of alloys thereof. Specific examples of memory materials encompassed by this system would include $(Te_{56}Ge_{22}Sb_{22})_{95}Ni_5$, $(Te_{56}Ge_{22}Sb_{22})_{90}Ni_{10}$, $(Te_{56}Ge_{22}Sb_{22})_{95}Cr_5$, $(Te_{56}Ge_{22}Sb_{22})_{90}Cr_{10}$, $(Te_{56}Ge_{22}Sb_{22})_{95}Fe_5$, $(Te_{56}Ge_{22}Sb_{22})_{90}Fe_{10}$, $(Te_{56}Ge_{22}Sb_{22})_{90}Ni_5Cr_5$, $(Te_{56}Ge_{22}Sb_{22})_{90}Ni_5Fe_5$, $(Te_{56}Ge_{22}Sb_{22})_{90}Cr_5Fe_5$, etc.

Second is a memory material which includes Te, Ge, Sb, Se and a transition metal, in the ratio $(Te_aGe_bSb_{100-(a+b)})_cTM_dSe_{100-(c+d)}$ where the subscripts are in atomic percentages which total 100% of the constituent elements, TM is one or more transition metals, a and b are as set forth hereinabove for the basic Te—Ge—Sb ternary system, c is between about 80 and 99% and d is between about 0.5 and 10%. The transition metal can preferably include Cr, Fe, Ni and mixtures of alloys thereof. Specific examples of memory materials encompassed by this system would include $(Te_{56}Ge_{22}Sb_{22})_{90}Ni_5Se_5$, $(Te_{56}Ge_{22}Sb_{22})_{80}Ni_{10}Se_{10}$, $(Te_{56}Ge_{22}Sb_{22})_{90}Cr_5Se_5$, $(Te_{56}Ge_{22}Sb_{22})_{80}Cr_{10}Se_{10}$, $(Te_{56}Ge_{22}Sb_{22})_{90}Fe_5Se_5$, $(Te_{56}Ge_{22}Sb_{22})_{80}Fe_{10}Se_{10}$, $(Te_{56}Ge_{22}Sb_{22})_{85}Ni_5Cr_5Se_5$, $(Te_{56}Ge_{22}Sb_{22})_{80}Ni_5Fe_5Se_{10}$, $(Te_{56}Ge_{22}Sb_{22})_{85}Cr_5Fe_5Se_5$, etc.

The memory elements of the instant patent application possess substantially non-volatile set resistance values. However, if the resistance value of the instant memory elements does, under some circumstances, drift from its original set value, "compositional modification", described hereinafter, may be used to eliminate for this drift. As used herein, the term "non-volatile" will refer to the condition in which the set resistance value remains substantially constant for archival time periods. Of course, software (including the feedback system discussed hereinafter) can be employed to insure that absolutely no "drift" occurs outside of a selected margin of error. Because drift of the resistance value of the memory elements can, if left unimpeded, hinder gray scale storage of information, it is desirable to minimize drift.

"Compositional modification" is deemed herein to include any means of compositionally modifying the volume of memory material to yield substantially stable values of resistance including the addition of band gap widening elements to increase the inherent resistance of the material. One example of compositional modification is to include graded compositional inhomogeneities with respect to thickness. For instances, the volume of memory material may be graded from a first Te—Ge—Sb alloy to a second Te—Ge—Sb alloy of differing composition. The compositional grading may take any form which reduces set resistance value drift. For example, the compositional grading need not be limited to a first and second alloy of the same alloy system. Also, the grading can be accomplished with more than two alloys. The grading can be uniform and continuous or it can also be non-uniform or non-continuous. A specific example of compositional grading which results in reduced resistance value drift includes a uniform and continuous grading of $Ge_{14}Sb_{29}Te_{57}$ at one surface to $Ge_{22}Sb_{22}Te_{56}$ at the opposite surface.

Another manner of employing compositional modification to reduce resistance drift is by layering the volume of memory material. That is, the volume of memory material may be formed of a plurality of discrete, relatively thin layers of differing composition. For example, the volume of memory material may include one or more pairs of layers, each one of which is formed of a different Te—Ge—Sb alloy. Again, as was the case with graded compositions, any combination of layers which results in substantially reduced resistance value drift can be employed. The layers may be of similar thickness or they may be of differing thickness. Any number of layers may be used and multiple layers of the same alloy may be present in the volume of memory material, either contiguous or remote from one another. Also, layers of any number of differing alloy composition may be used. A specific example of compositional layering is a volume of memory material which includes alternating layer pairs of $Ge_{14}Sb_{29}Te_{57}$ and $Ge_{22}Sb_{22}Te_{56}$.

Yet another form of compositional inhomogeneity to reduce resistance drift is accomplished by combining compositional grading and compositional layering. More particularly, the aforementioned compositional grading may be combined with any of the above described compositional layering to form a stable volume of memory material. Exemplary volumes of memory material which employ this combination are: (1) a volume of memory material which includes a discrete layer of $Ge_{22}Sb_{22}Te_{56}$ followed by a graded composition of $Ge_{14}Sb_{29}Te_{57}$ and $Ge_{22}Sb_{22}Te_{56}$ and (2) a volume of memory material which includes a discrete layer of $Ge_{14}Sb_{29}Te_{57}$ and a graded composition of $Ge_{14}Sb_{29}Te_{57}$ and $Ge_{22}Sb_{22}Te_{56}$.

Referring now to FIG. 1, there is shown a cross-sectional view of a portion of the structure of an electrically erasable memory of the present invention formed on a single crystal silicon semiconductor wafer 10 which is p-doped and which forms a p-substrate for the deposition of the remaining elements of the configuration illustrated. Formed in the p-substrate 10 are n+ channels 12, which may be diffusion doped in a manner well known in the art. These n+ channels extend across the chip in a direction perpendicular to the plane of the illustration and form one set of electrodes, in this case the y set, of an x-y electrode grid for addressing the individual memory elements.

A top of this n+ grid structure is formed an n-doped crystalline epitaxial layer 14 about 5,000 Å thick. Using known masking and doping techniques, p-doped isolation channels 16 are then formed in the n-epitaxial layer 14. These p-doped isolation channels 16 extend all the way down to the p substrate 10 as shown in FIG. 1 and also extend completely around and isolate and define islands 18 of the n-epitaxial layer 14. The islands 18 are shown more clearly in the top view of FIG. 2 wherein the p isolation channels are shown as forming an isolation grid defining and isolating the islands 18 of n epitaxial material. Instead of the p-doped isolation channels, $SiO_2$ isolation trenches may be used for isolation of the islands 18. The technique of formation of such $SiO_2$ isolation trenches is well known to those skilled in the art. A layer 20 of thermally grown $SiO_2$ is then formed on the structure just described and etched to form apertures 22 over the islands 18. Diffusion regions 24 of p+ material are then formed within the areas defined by the apertures 22 as shown in FIG. 1. The semiconductor junctions of the p+ regions and the n epitaxial layer define p-n junction dimes 26 in series with each of the regions of the n epitaxial layer exposed through the apertures 22 of the $SiO_2$ layer 20.

The memory elements 30 are then deposited over the p+ regions 24 in individual ohmic electrical series contact with the dimes 26. The memory elements 30 comprise bottom thin electrical contact layers of high corrosion resistance metal (such as, for example, molybdenum) 32. Previously, in the Ovonic EEPROM, single layers of electrically conductive amorphous carbon were used as diffusion barrier layers 34 and 38; however, in the structurally modified memory elements of the instant invention these a-carbon layers have been modified or replaced. This modified structure includes either a single amorphous silicon layer in place of the amorphous carbon layer or a thin silicon layer disposed between the amorphous carbon layer and the layer of memory material 36. The upper thin electrical contact layer of corrosion resistance material 40 is fabricated of molybdenum and the electrically conductive diffusion barrier layer 38 is fabricated of a-carbon, a-silicon or a dual a-carbon/a-silicon structure. The contact layers 32, 34, 38 and 40 form excellent electrical contacts with the layers of memory material 36 and layers 34 and 38 also form diffusion barriers which inhibit diffusion of the molybdenum metal and/or an optional external contact grid material contact into the volume of chalcogenide memory material 36. The a-silicon of layers 34 and 38, when used in combination with a-carbon are relatively thin, typically in the range of 50 to 600 Å and more particularly 100 to 400 Å. When used alone as layers 34 and 38, the a-silicon layers are between about 400 and 2000 Å depending on the electrical resistivity thereof. The molybdenum layers 32 and 40 are relatively thick, in the range of about 1,000 to 2,000 Å. The filament controlling silicon nitride layer (not shown) is formed at the interface between the memory layer 36 and the lower carbon contact 34.

The layer of memory material 36 is formed of a multi-element semiconductor material, such as the chalcogenide materials disclosed herein. The layer 36 may be deposited by methods such as sputtering, evaporation or by chemical vapor deposition (CVD), which may be enhanced by plasma techniques such as RF glow discharge. The chalcogenide memory materials of the instant invention are most preferably made by RF sputtering and evaporation. Typical deposition parameters for RF sputtering and evaporation of the chalcogenide layer 36 are set forth below in Tables 2 and 3, respectively.

TABLE 2

RF Sputtering Deposition Parameters

| Parameter | Typical Range |
| --- | --- |
| Base pressure | $8 \times 10^{-7}$–$1 \times 10^{-6}$ Torr |
| Sputtering gas (Ar) pressure | 4–8 m Torr |
| Sputtering power | 40–60 watts |
| Frequency | 13–14 MHz |
| Deposition Rate | 0.5–10 Å/second |
| Deposition Time | 2–25 minutes |
| Film Thickness | 250–1500 Å |
| Substrate Temp. | Ambient–300° C. |

TABLE 3

Evaporation Deposition Parameters

| Parameter | Typical Range |
| --- | --- |
| Base pressure | $1 \times 10^{-6}$–$5 \times 10^{-6}$ Torr |
| Evaporation Temp. | 450–600° C. |
| Deposition Rate | 2–4 Å/second |
| Deposition Time | 2–20 minutes |
| Film Thickness | 250–1500 Å |
| Substrate Temp. | Ambient–300° C. |

It is important to note that evaporated rims deposited on a heated substrate exhibit anisotropic growth characteristics (see the description of FIG. 7) in which oriented layers of the chalcogenide elements are successively deposited. Whether this proves to be significant for electrical applications has yet to be proven; however, this type of film holds promise for thermoelectricity (due to the high thermopower already measured for these compositions, i.e., a factor of four greater than that measured for bismuth systems) or for specific semiconductor and superconductivity applications.

The layer of memory material 36 is preferably deposited to a thickness of about 200 Å to 5,000 Å, more preferably of about 400 Å to 2,500 Å and most preferably of about 250 Å to 1,250 Å in thickness. The lateral dimension or diameter of the pore of semiconductor material 36 is less than about one to two micrometers or so, although there is no practical limit on the lateral dimension. It has been determined that the diameter of the actual conductive path of the high conductivity material is significantly less than a micrometer. The pore diameter can thus be as small as lithography resolution limits will permit and, in fact, the smaller the pore, the lower the energy requirements for electrical switching.

In a preferred embodiment of the present invention, the pore diameter is selected such that it conforms substantially with the diameter of the low resistance path which is formed when the material is switched to the low resistance state. The diameter of the pore of memory material 36 is therefore preferably less than about one micrometer so that the volume of the memory material 36 is limited, to the extent lithographically possible, to the volume of the material 36 which is actually switched between the various states of resistance. This further reduces the switching time and the electrical energy required to initiate the detectable change in resistance. The term "pore diameter" as used herein shall mean the lateral cross-sectional dimension of the layer of memory material 36 which extends under the contact regions formed with the memory layer 36 and with the lower p+ layer and the upper conductors 42 as shown in the embodiment of FIG. 1. It is further preferred that the pore regions of the memory elements 30 be thermally isolated and/or controlled except for such electrical contact with the upper and lower electrodes as is necessary for proper operation of the memory elements. This further confines, limits and controls the heat transfer from the switched volume of the pore and the electrical energy required for the resistance transitions. This is accomplished in the embodiment of FIG. 1 by the oxide layers 20 and 39 which surround the lateral periphery of the memory elements 30. Accordingly, in order to minimize set energy/current/voltage, small pore diameters of as low as 250 Å may be employed.

The layers 32, 34, 36, 38 and 40 are etched and an oxide layer 39 is formed thereover and etched to leave openings above the memory elements 30 as shown. Alternatively, the memory elements may be formed in a two step etch process with layers 32 and 34 being first deposited and then etched over the top of which the remaining layers 36, 38 and 40 are deposited and then separately etched to the selected dimension. Deposited on top of the entire structure formed by layers 32, 34, 36, 38, and 40 is the second electrode grid structure formed of aluminum conductors 42, which extend perpendicular in direction to the conductors 12 and complete the x-y grid connection to the individual memory elements. Overlaying the complete integrated structure is a top encapsulating layer 44 of a suitable encapsulant such as $Si_3N_4$ or a plastic material such as polyamide, which seals the structure against moisture and other external elements which could cause deterioration and degradation of performance. The $Si_3N_4$ encapsulant can be deposited, for example, using a low temperature plasma deposition process. The polyamide material can be spin deposited and baked after deposition in accordance with known techniques to form the encapsulant layer 44.

It is important to note that conventional CMOS technology cannot be used to produce this type of three dimensional memory array since CMOS technology builds the required semiconductor devices into the bulk of single crystal semiconductor wafers and, therefore, can only be used to fabricate a single layer of devices. Furthermore, (1) CMOS cannot produce a small enough footprint (actual element dimension) to cost effectively produce large arrays and (2) CMOS devices, because they exist in a single plane, cannot be interconnected along the Z direction. Therefore, CMOS devices cannot be fabricated with the complex, three-dimensional interconnectivity required for advanced parallel processing computers. The three-dimensional, thin-film memory array structures of the instant invention, on the other hand are capable of both conventional serial information processing as well as parallel information processing.

Parallel processing and therefore multidimensional memory array structures are required for rapid performance of complex tasks such as pattern recognition, classification or associative learning etc. Further uses for and description of parallel processing are presented in U.S. Pat. No. 5,159,661 which is assigned to the assignee of the instant application and the disclosure of which is hereby incorporated by reference. With the integrated structure as shown in the embodiment of FIG. 1; however, a completely vertically integrated structure of the memory element and its isolating diode is formed, thus minimizing the area occupied on the substrate by each of the combinations of memory elements and diodes. This means that the density of the memory elements in the chip is limited essentially only by the resolution capabilities of the lithography.

Figure 2:
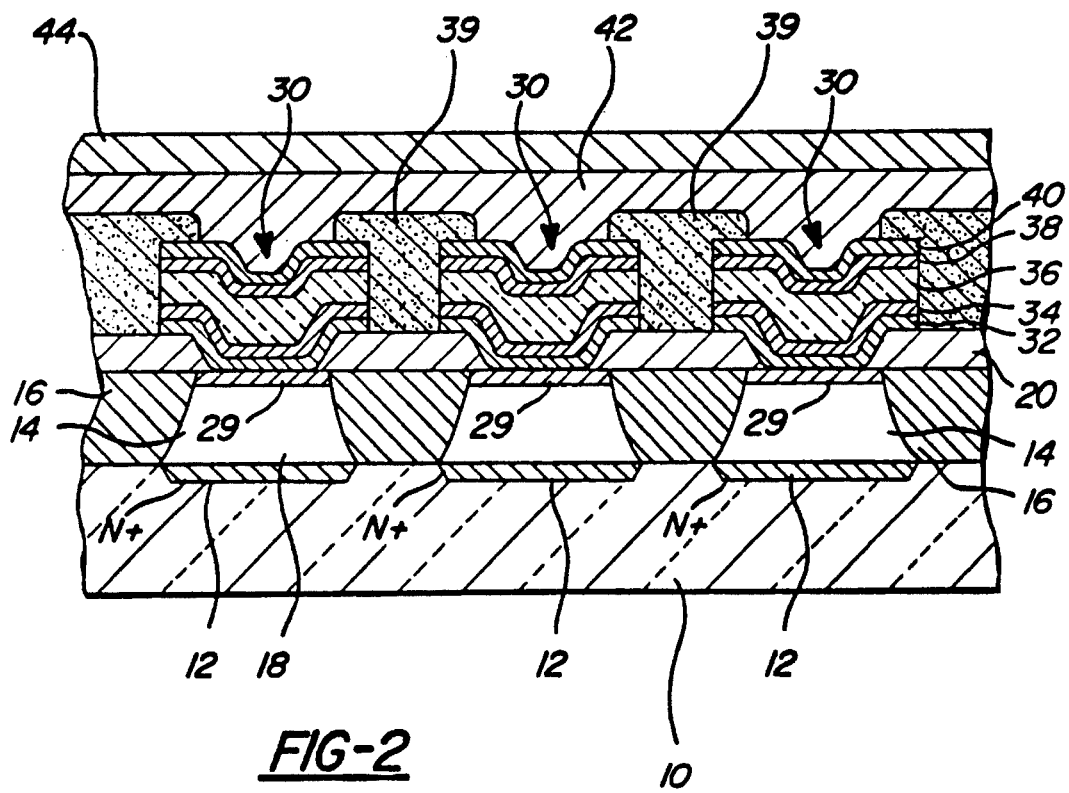
FIG. 2 is a fragmentary cross-sectional view illustrating a portion of an integrated circuit, said circuit depicting an electrically erasable and directly overwritable multilevel memory configuration of a second preferred embodiment of the present invention.

The embodiment of FIG. 2 is the same as FIG. 1 except that a diode 27 is formed as a Schottky barrier operatively disposed between the n layer 14 and a metal layer 29 which may be, for example, platinum silicide. In other respects, the structural embodiment of memory cell/isolation element depicted in FIG. 2 is formed in the same manner as that of FIG. 1 and like elements are labeled with like reference numerals.

Figure 3:
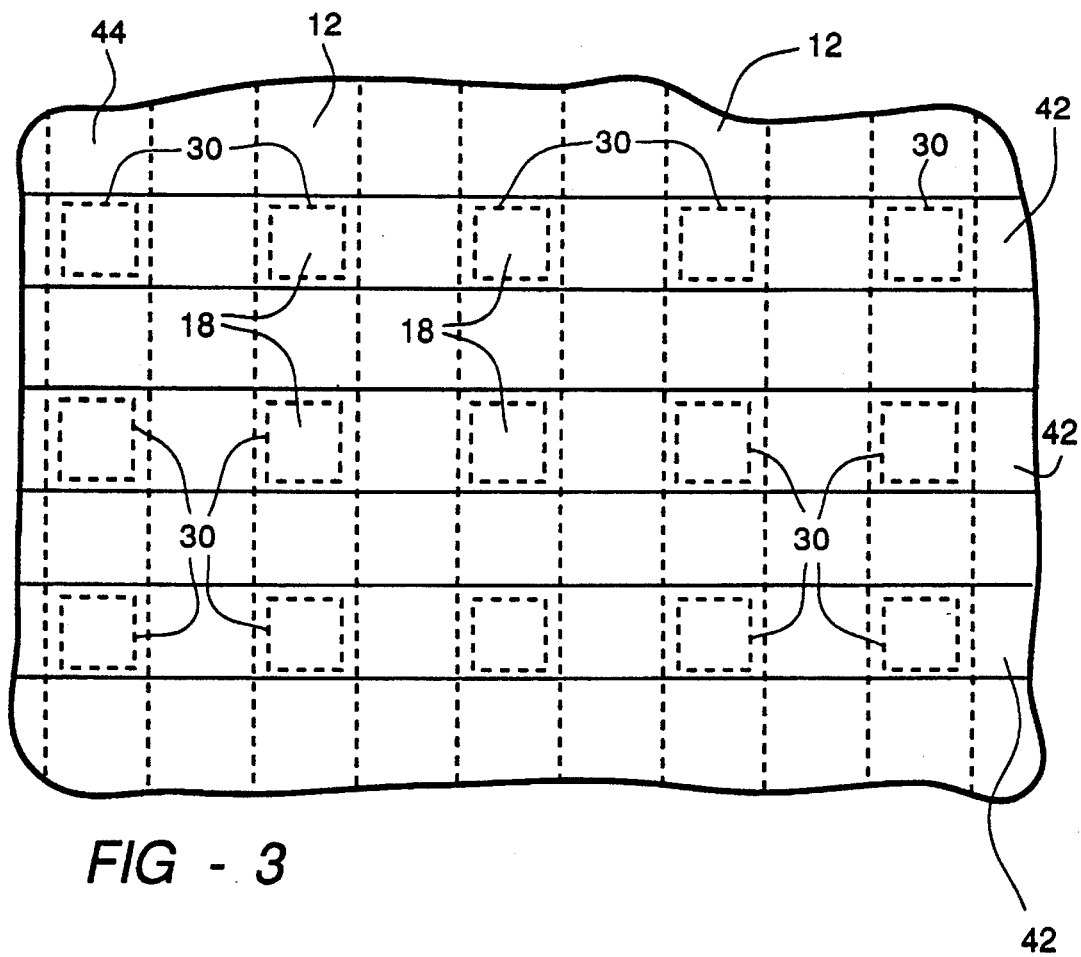
FIG. 3 is a top plan view schematically illustrating a portion of the integrated circuit configurations of FIGS. 1 and 2.

The integrated structure thus formed is an x-y memory matrix connected as shown in FIG. 3 in which each memory element 30 is connected in series with a diode 26 between a horizontal x-line 42 and a vertical y-line 12. The diodes 26 serve to electrically isolate each of the memory elements 30. Other circuit configurations for the electrically erasable memory of the present invention are, of course, possible and feasible to implement. One particularly useful configuration is a three dimensional, multilevel array in which a plurality of planes of memory or control elements and their respective isolation devices are stacked upon one another. Each plane of memory elements is arranged as a plurality of rows and columns of memory elements, thereby allowing for X-Y addressing. This stacking of planes, in addition to increasing memory storage density, allows for an additional Z dimension of interconnection. This arrangement is particularly useful to simulate a neural network for a truly intelligent computer.

Figure 4:
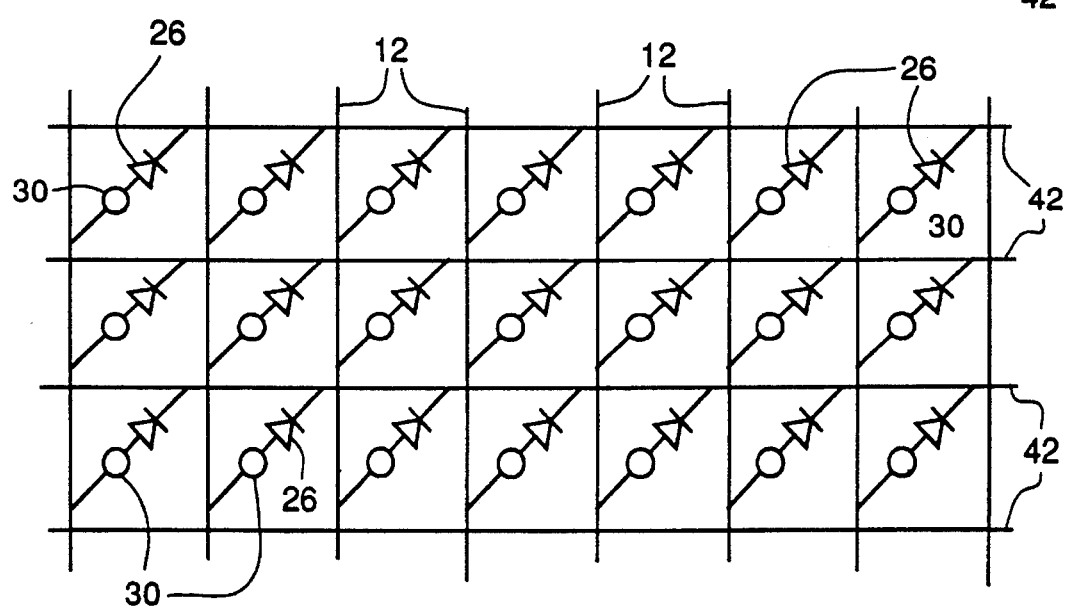
FIG. 4 is a schematic circuit diagram illustrating a portion of the X-Y matrix array of isolation elements in combination with the memory elements of the integrated circuit configurations of FIGS. 1 and 2.

FIG. 4 is a stylized, schematic circuit diagram of a portion of the memory cell embodiments of FIG. 1. The circuit comprises an x-y grid with each of the memory elements 30 being electrically interconnected in series with an isolation diode 26 at the cross points of the x address lines 42 and the y address lines 12 as shown. The address lines 12 and 42 are connected to external addressing circuitry in a manner well known to those skilled in the art. The purpose of the x-y matrix of memory elements in combination with isolation elements is to enable each one of the discrete memory elements to be read and written without interfering with information stored in adjacent or remote memory elements of the matrix.

Figure 5:
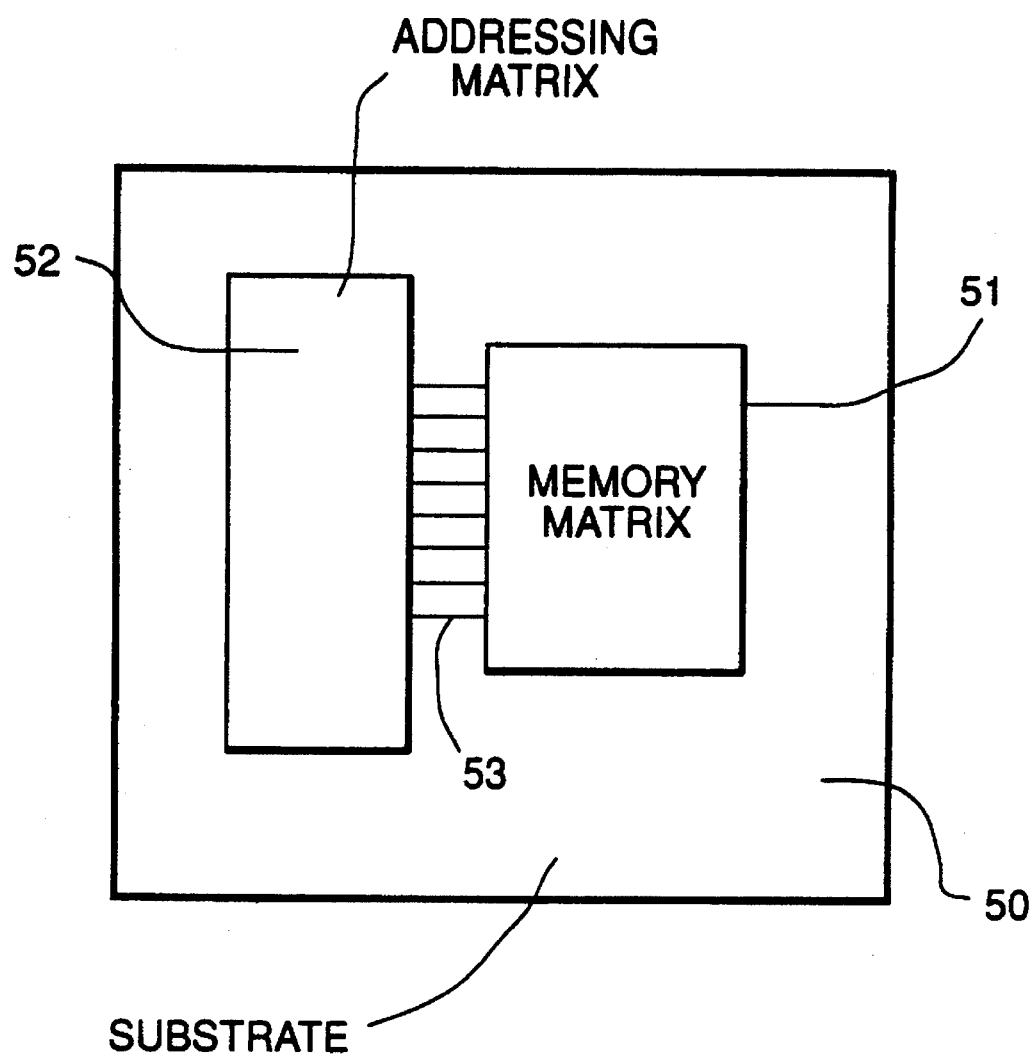
FIG. 5 is a schematic representation illustrating a single crystal semiconductor substrate with the integrated memory matrix of the instant invention as depicted in FIGS. 1 and 2 placed in electrical communication with an integrated circuit chip on which the address/drivers/decoders are operatively affixed.

In FIG. 5, there is diagrammatically illustrated a portion of a single crystal semiconductor substrate 50 with a memory matrix 51 of the present invention formed thereon. Also formed on the same substrate 50 is an addressing matrix 52 which is suitably connected by integrated circuitry connections 53 to the memory matrix 51. The addressing matrix 52 includes signal generating means which define and control the setting and reading pulses applied to the memory matrix 51. Of course, the addressing matrix 52 may be integrated with and formed simultaneously with the solid state memory matrix 51.

In prior an semiconductor memories having the relatively high switching speeds and low switching energies deemed necessary for most applications thereof, at least one transistor and a capacitor is required for each memory element. The formation of such memories in integrated circuit form requires at least three connections along with other additional complexities which occupy a certain minimum substrate area regardless of how the integrated circuit is laid out. The integrated circuit configuration of the electrically erasable memory of the present invention requires only two connections to each memory element and these can be made in vertical relationship to each other. Further, each memory element, complete with isolating diode and the pair of contacts for the element, is itself fully vertically integrated such that a significantly higher bit density is possible. In fact, the memory of the present invention provides for a bit density which is greater than that attainable even in solid state dynamic random access memories (DRAMs), which are volatile and therefore lack the further advantages that the non-volatility attainable with the present invention provides. The increase in bit density attainable with the present invention translates into a corresponding reduction in manufacturing costs because of the smaller areas of the wafer occupied per bit of the integrated circuit configuration. This allows the memory of the present invention to compete with and surpass other available memories for a wider range of applications, not only in terms of electrical performance and memory storage capacity, but also in terms of cost. By comparison with prior art semiconductor memories formed of at least one transistor and a capacitor for each bit, the integrated circuit configurations of the present invention, as shown in FIG. 1, can be formed on a chip with greater bit density compared to prior art configurations using the same photo lithographic resolution. In addition to the cost advantages that the higher bit density affords, the elements are positioned closer together and lead lengths, capacitances, and other related parameters are further minimized, thereby enhancing performance.

Through experimentation, the inventor has shown that factors such as pore dimensions (diameter, thickness, and volume), chalcogenide composition, thermal preparation (post deposition anneal), signal pulse duration, impurities such as oxygen present in the composition, crystallite size and signal pulse waveform shape have an effect on the magnitude of the dynamic range of resistances, the absolute end-point resistances of said dynamic range, and the voltages required to set the device at these resistances. For example, relatively thick chalcogenide films (i.e. about 4000 Å) will result in higher set voltage requirements (and therefore higher current densities within the volume of memory material), while relatively thin chalcogenide layers (i.e. about 250 Å) will result in lower set voltage (and current density) requirements. Of course, the possible significance of crystallite size and, therefore, the ratio of the number of surface atoms relative to the number of bulk atoms has previously been described.

The signal pulse duration required to set the memory element to the desired resistance level within the dynamic range of electrical resistances will likewise be dependent upon all of the foregoing factors as well as signal voltage. Typically signal pulse durations will be less than about 250 nanoseconds and preferably less than about 50 nanoseconds. It is to be stressed that even the short 25 nanosecond pulse widths noted are dependent on the size and shape of the pore as well as the thickness and composition of the semiconductor alloy employed. It is believed that the pulse durations can be significantly reduced without interfering with the operation of the memory switch. As a matter of fact, with the input of lesser amounts of energy, the cycle life of the elements can only increase.

A feedback loop which reads and, when required, adjusts the resistance of a given memory element may be incorporated into the memory systems of the instant invention. For example, a memory element may initially be set at a desired resistance; however, in time the resistance of the element may drift slightly from the value at which it was originally set. The feedback loop, in this instance, would calculate and deliver a refresh signal pulse of the required voltage and duration to the memory element to bring it back to a preselected resistance value. Also, circumstances may exist where the set pulse delivered to a memory element may not result in setting of the element at the desired resistance value. In this case the feedback loop would deliver additional signal pulses to the element until the desired resistance level is achieved. The total duration of this series of set/adjust cycles is less than about 1,000 nanoseconds and preferably less than about 500 nanoseconds.

The ability to reversibly move up and down the linear portion of the resistance versus voltage curve cannot be overemphasized. A signal pulse of a selected voltage will set the memory element to a desired resistance, regardless of the previous set condition thereof. This ability to reversibly move along the curve provides for direct overwrite of previously stored dam. Such direct overwrite capability is not possible with the phase change and MSM (a-Si) memory materials of the prior art. This ability to reversibly set intermediate resistance values is remarkable. A thousand successive 5-volt pulses achieves the same resistance value as an 8-volt pulse followed by a single 5-volt pulse or a 4-volt pulse followed by a single 5-volt pulse.

The dynamic range of resistances also allows for broad gray scale and multilevel analog memory storage. This multilevel memory storage is accomplished by dividing the broad dynamic range into a plurality of sub-ranges or levels. This analog storage ability allows for multiple bits of binary information to be stored in a single memory cell. This multilevel storage is accomplished by mimicking multiple bits of binary information in analog form and storing this analog information in a single memory cell. Thus, by dividing the dynamic range of resistances into 3 or more analog levels, each memory Cell would be provided with the capability of storing 1 and ½ or more bits of binary information.

As indicated hereinabove, FIG. 6 is a ternary diagram of the Ge—Te—Sb semiconductor alloy system. In addition to the information previously discussed of which the binary and ternary phases are indicated by squares (■), this diagram gives information on the segregation of other alloys. These other alloys are indicated by triangles (▲), diamonds (♦) and circles (●) and the phases into which the alloys segregate, upon rapid solidification from the melt, are indicated by the lines (solid or dashed) which extend therefrom. The starting compositions of two Te-rich melts are indicated by circular symbols on the ternary diagram. Upon rapid solidification, these mixtures phase segregate into elemental Te plus phases B, C and D.

Melts with compositions to the right of the pseudobinary line, indicated by diamond symbols, solidify into the phases indicated by the lines on the diagram. Other mixtures, indicated by triangles in the phase diagram, solidify into elemental Ge and Sb and into phase A. Phase A is found in the rapid solidification of all melts where the composition of the melt is close to that of phase A, an also in the compositions indicated by the triangle symbols on the diagram. A molten mixture of compositions identical to that of phase A forms nearly pure phase A upon rapid solidification. This phase is the only phase which shows this characteristic. An alloy of particular interest for use in the improved memory elements of the present invention is $Ge_{22}Sb_{22}Te_{56}$, also referred to as $Ge_2Sb_2Te_5$ or 2-2-5. This 2-2-5 alloy, upon rapid solidification, phase segregates into a mixture of two distinct phases of compositions B ($Ge_{26}Sb_{18}Te_{56}$) and C ($Ge_{18}Sb_{26}Te_{56}$) indicated in the phase diagram of FIG. 6. Another alloy of particular interest is $Ge_{14}Sb_{29}Te_{57}$ (also referred to as $GeSb_2Te_4$ or 1-2-4) which is composition D on the $GeTe$—$Sb_2Te_3$ pseudobinary line. The 2-2-5 and 1-2-4 alloys are of interest for forming the volume of memory material in compositionally graded, layered or combine graded/layered form, as discussed hereinabove.

Figure 7:
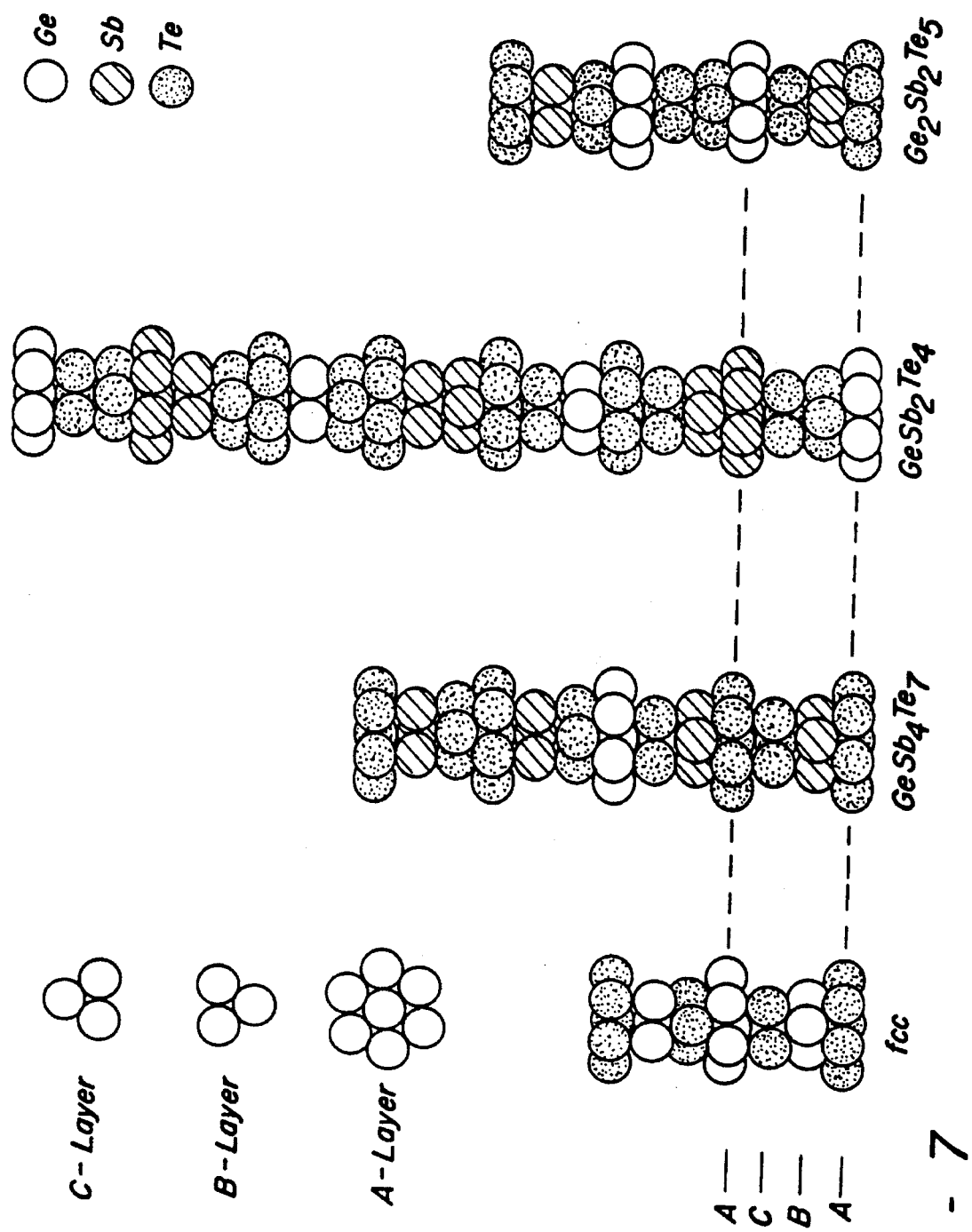
FIG. 7 depicts the atomic structural layering of three ternary alloys of the Ge—Sb—Te system of FIG. 6 as well as the atomic structure of binary Ge—Te so as to illustrate the anisotropic structure of the systems.

FIG. 7 depicts the atomic structure of three ternary alloys of the Ge—Sb—Te system as well as the atomic structure of the binary alloy Ge—Te. Two of the three ternary alloys are the 1-2-4 (composition D on the ternary diagram of FIG. 6) and the 2-2-5 compositions described hereinabove. The third ternary alloy is $Ge_8Sb_{33}Te_{59}$ which is also referred to as $GeSb_4Te_7$ or 1-4-7. This 1-4-7 alloy corresponds to composition E on the ternary phase diagram of FIG. 6. In the depictions of the atomic structures of these alloys, the hollow circles represent Ge atoms, the striated circles represent Sb atoms and the stippled circles depict Te atoms. As shown by FIG. 7, the atomic configuration of each of the alloys, when in the face centered cubic crystalline structure, is formed of ordered, repeated layers of atoms. The fcc configuration form three distinct types of layers which are labeled A, B and C in FIG. 7.

The 1-4-7, 1-2-4, and 2-2-5 alloys depicted in FIG. 7 are of interest as base memory materials and for use in the elementally modified memory materials of the instant invention. The transition metals, along with Se, when present, are incorporated relatively uniformly throughout the Te—Ge—Sb matrix and enhance the electronic/atomic structure so as to produce reduced switching current requirements and increased thermal stability of data retention. Current analysis shows that the Se replaces Te in the structure, and while the exact positioning of the transition metal is not known, it appears that the transition metal bonds with the chalcogen element.

Also, as mentioned hereinabove, when the Ge—Sb—Te ahoy materials are deposited by evaporation onto a heated substrate, the materials are deposited in anisotropic form. That is, when deposited in this fashion, the crystallites of the alloy materials are oriented such that the layers of constituent atomic elements are aligned substantially parallel to the substrate surface. This will, of course, result in anisotropic current flow, but offers the long term possibility of arranging the atoms of the material so as to employ set and reset pulses in the low resistance direction and thereby achieve still lower set and reset currents, voltages and/or energies.

Most recently, the instant inventors have determined that memory elements of the instant invention which employ a filament confining means between at least one of the spacedly disposed electrodes and the volume of memory material provides for memory elements with better thermal stability, lower set/reset current requirements, longer cycle life, and a larger dynamic range of resistances. In these elements, resistance switching appears to occur in a filamentary portion of the volume of memory material and the filamentary portion appears to be affected by the filament confining means. Typically the filament confining means is a thin film layer disposed between one of the spacedly disposed contacts and the volume of memory material and preferably this thin-film layer is between 10 and 100 Angstroms thick. This thin film layer is formed of highly resistive material and has at least one low resistance pathway thereacross, through which electrical signals pass between the contact and the volume of memory material. The area of the low resistance pathway in the highly resistive thin film layer may be less than about 2 percent of the area of contact between the thin film layer and the volume of memory material. An exemplary thin film layer is formed of a silicon nitride material which includes silicon, nitrogen and hydrogen. The composition of this film is preferably, in atomic percent, between about 30–40% silicon, 40–50% nitrogen and up to 30% H.

Figure 8:
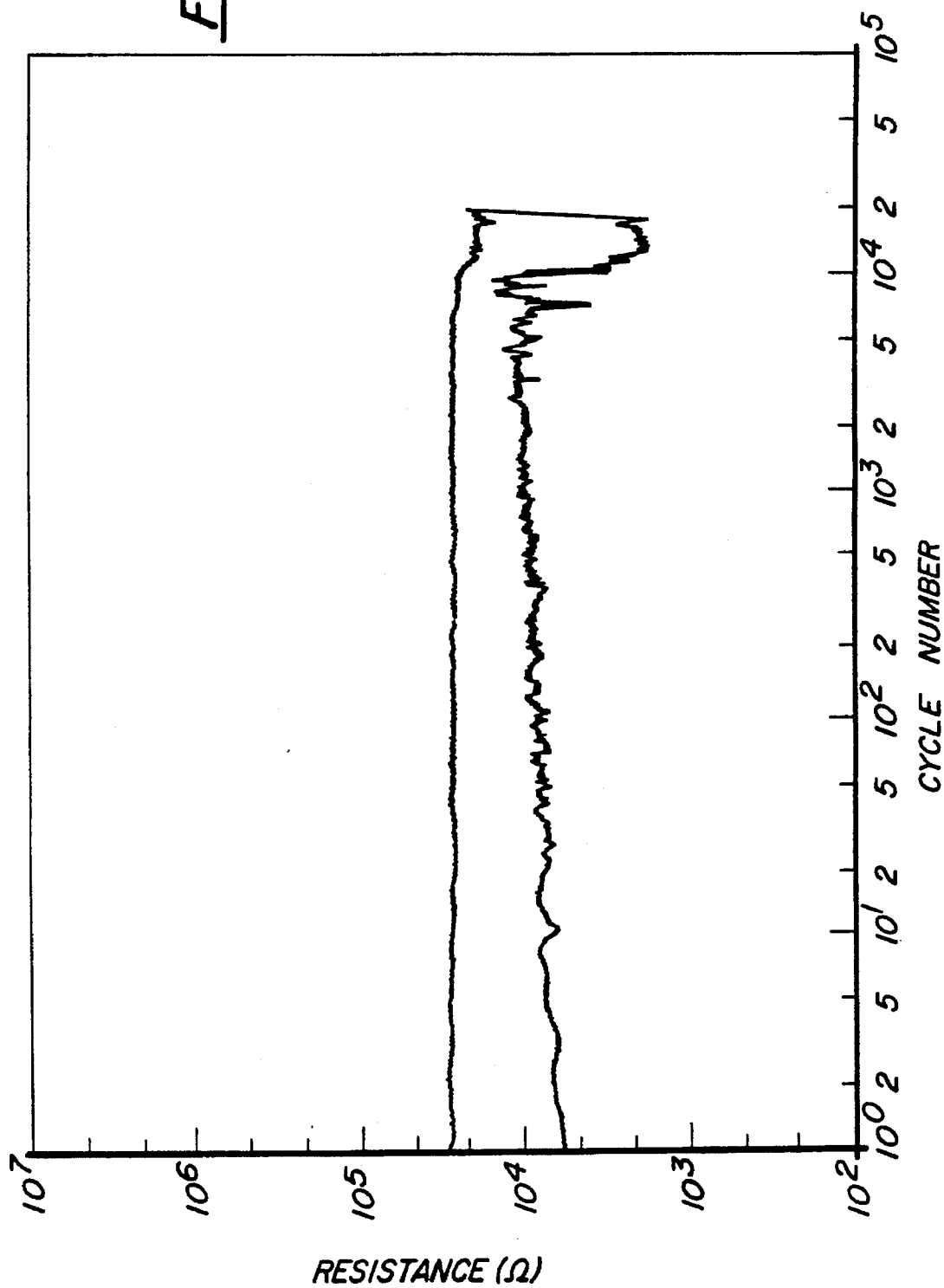
FIG. 8 is a graphical depiction of data illustrating cycling characteristics of a first memory element without the filament confining layer of the present invention.

FIG. 8 is a graphical depiction of data illustrating cycling characteristics of a memory element without the filament confining layer of the present invention. In this graph, device resistance is plotted on the ordinate and cycle number is plotted on the abscissa. The data was created by cycling the memory element in binary fashion using 400 nsec, 2 Volt pulses to set the material to a "low" resistance and 40 nsec, 6 Volt pulses to set the material to a "high" resistance. As can be determined from this figure, the dynamic range of resistance is relatively small, 20 kohms at best falling to 10 kohms near device breakdown. Also, the device has a relatively short cycle life, less than $1\times10^4$ cycles, and the cycling current is relatively large (i.e. 400 nsec set pulses).

Figure 9:
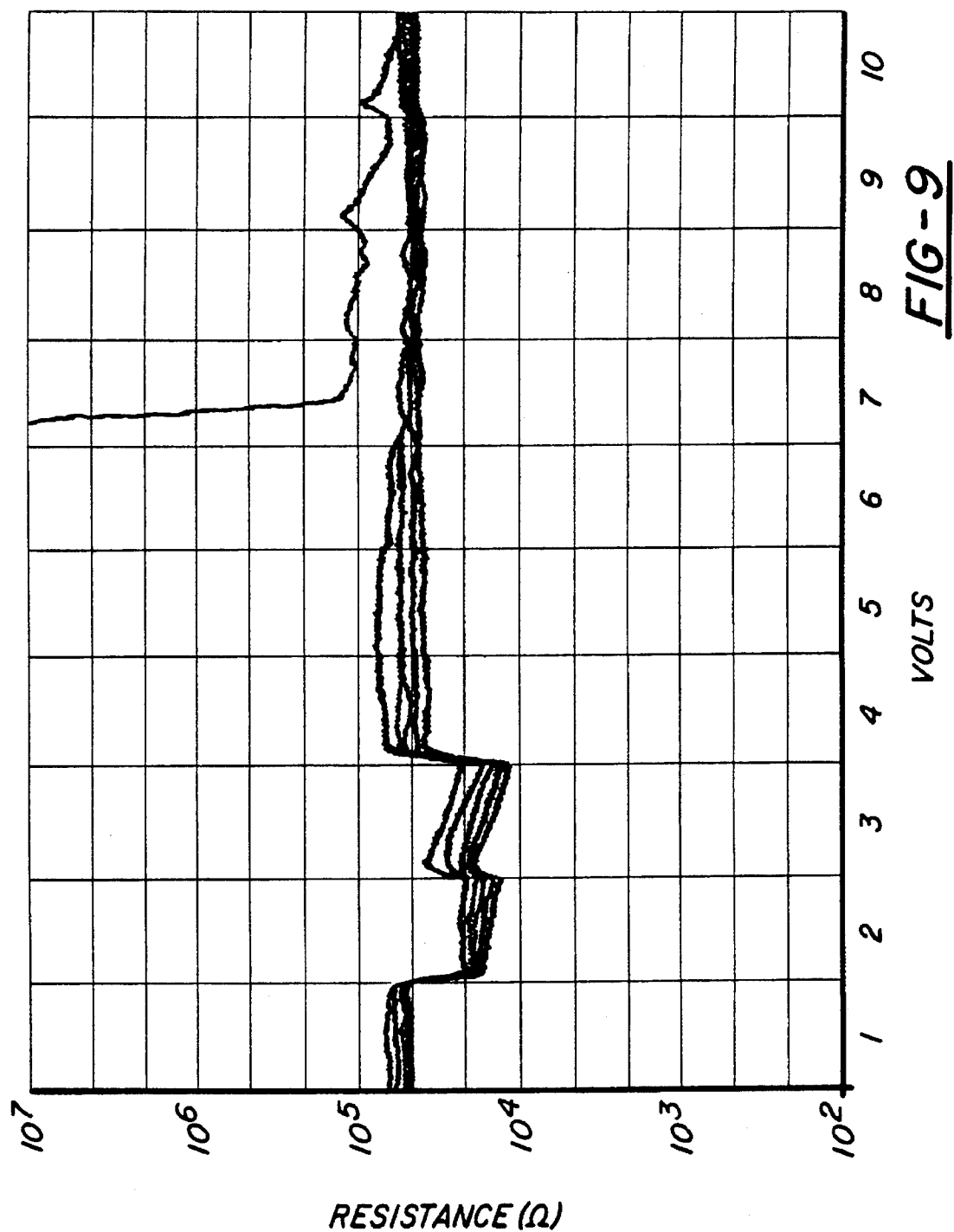
FIG. 9 is a graphical depiction of data illustrating multistate capabilities (i.e. ability of the memory element to be set to multiple resistance levels within the dynamic range of resistances) of a first memory element without the filament confining layer of the present invention.

FIG. 9 is a graphical depiction of data illustrating multistate capabilities (i.e. ability of the memory element to be set to multiple resistance levels within the dynamic range of resistances) of a memory element without the filament confining layer of the present invention. In this graph, device resistance is plotted on the ordinate and set pulse voltage is plotted on the abscissa. The data was created by pulsing the memory element with 200 nsec set pulses of varying voltage from 1 to 10 volts. The memory element was pulsed with 10 pulses at 1 volt and the device resistance was measured. The voltage was increased to 2 volts and another 10 pulses were applied, again the device resistance was measured. The voltage was incremented in this manner up to 10 volts. This test was performed 10 times (i.e. ten sets of incrementation from 1 to 10 volts). A perusal of this figure clearly indicates that this memory element which lacks the filament confining layer does not exhibit multistate abilities.

Figure 10:
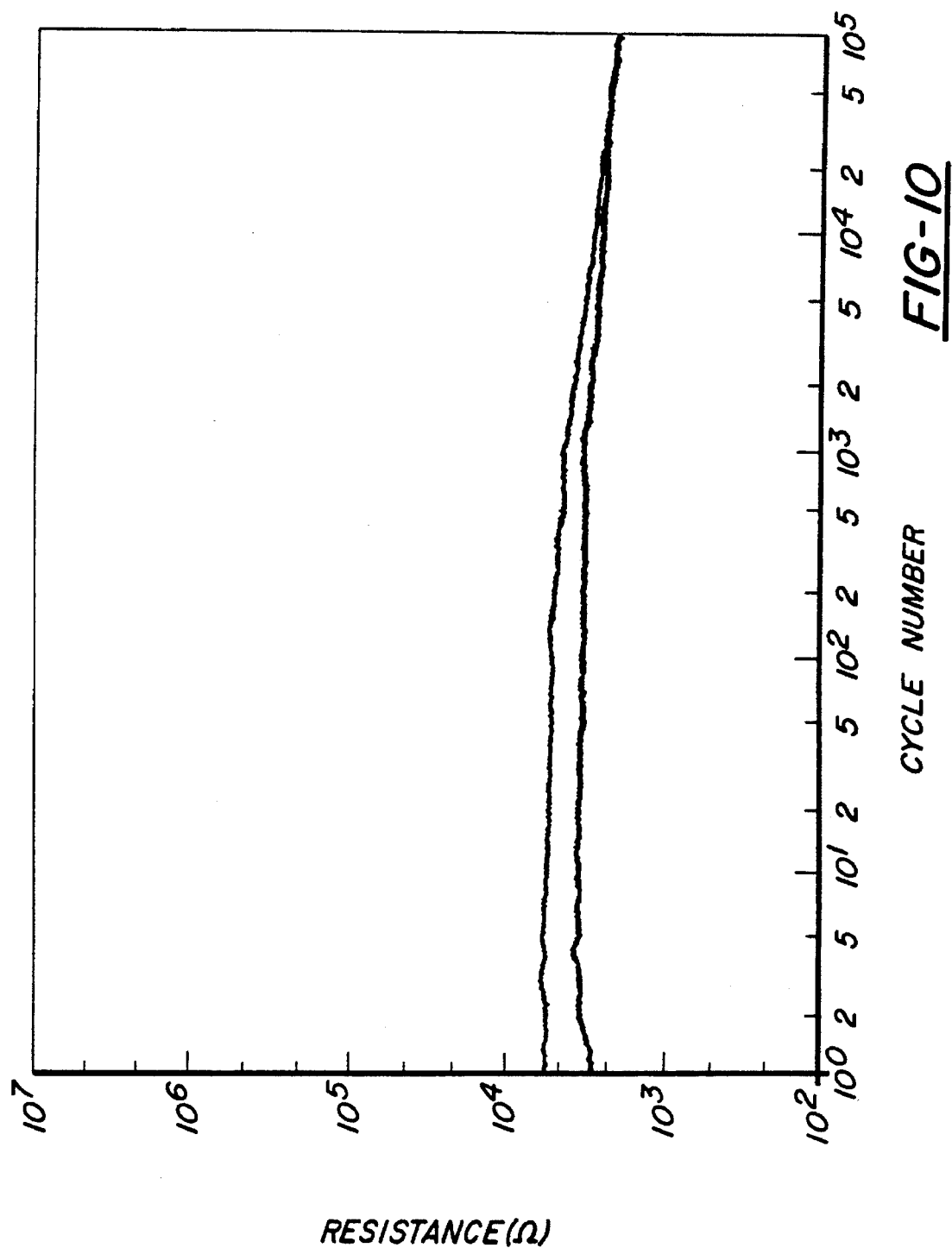
FIG. 10 is a graphical depiction of data illustrating cycling characteristics of a second memory element without the filament confining layer of the present invention.

FIG. 10 is a graphical depiction of data illustrating cycling characteristics of a memory element without the filament confining layer of the present invention. In this graph, device resistance is plotted on the ordinate and cycle number is plotted on the abscissa. The data was created by cycling the memory element in binary fashion using 200 nsec, 1.8 Volt pulses to set the material to a "low" resistance and 100 nsec, 6 Volt pulses to set the material to a "high" resistance. As can be determined from this figure, the dynamic range of resistance is extremely small, 2 kohms at best falling to less than 100 ohms near device breakdown. Also, the device has a relatively short useable cycle life, less than $1\times10^4$ cycles.

Figure 11:
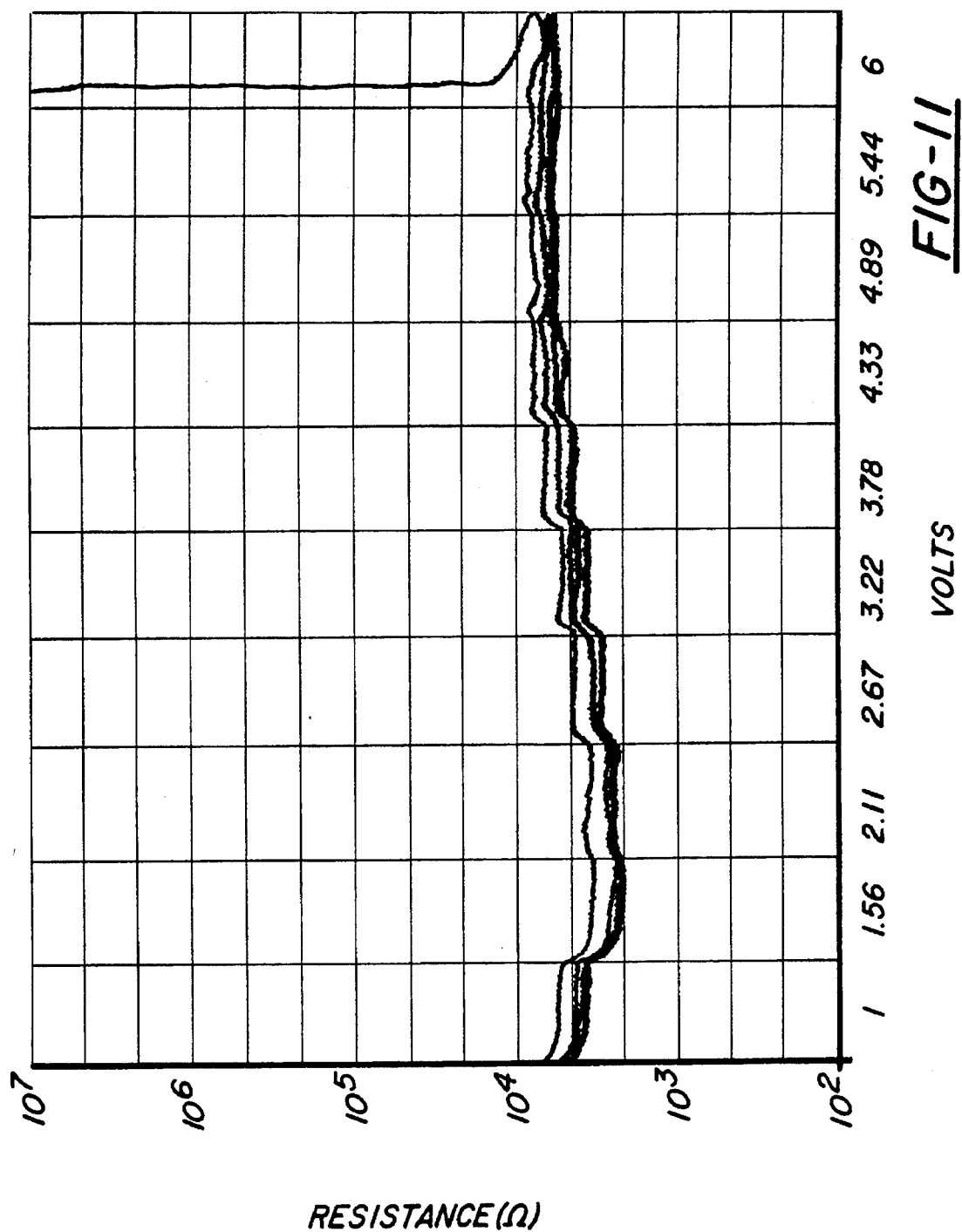
FIG. 11 is a graphical depiction of data illustrating multistate capabilities (i.e. ability of the memory element to be set to multiple resistance levels within the dynamic range of resistances) of a second memory element without the filament confining layer of the present invention.

FIG. 11 is a graphical depiction of data illustrating multistate capabilities (i.e. ability of the memory element to be set to multiple resistance levels within the dynamic range of resistances) of a memory element without the filament confining layer of the present invention. In this graph, device resistance is plotted on the ordinate and set pulse voltage is plotted on the abscissa. The data was created by pulsing the memory element with 200 nsec set pulses of varying voltage from 1 to 6 volts. The memory element was pulsed with 10 pulses at 1 volts and the device resistance was measured. The voltage was increased to 1.56 volts and another 10 pulses were applied, again the device resistance was measured. The voltage was incremented in this manner up to 6 volts. This test was performed 7 times (i.e. seven sets of incrementation from 1 to 6 volts). A perusal of this figure clearly indicates that this memory element which lacks the filament confining layer does not exhibit multistate abilities.

Figure 12:
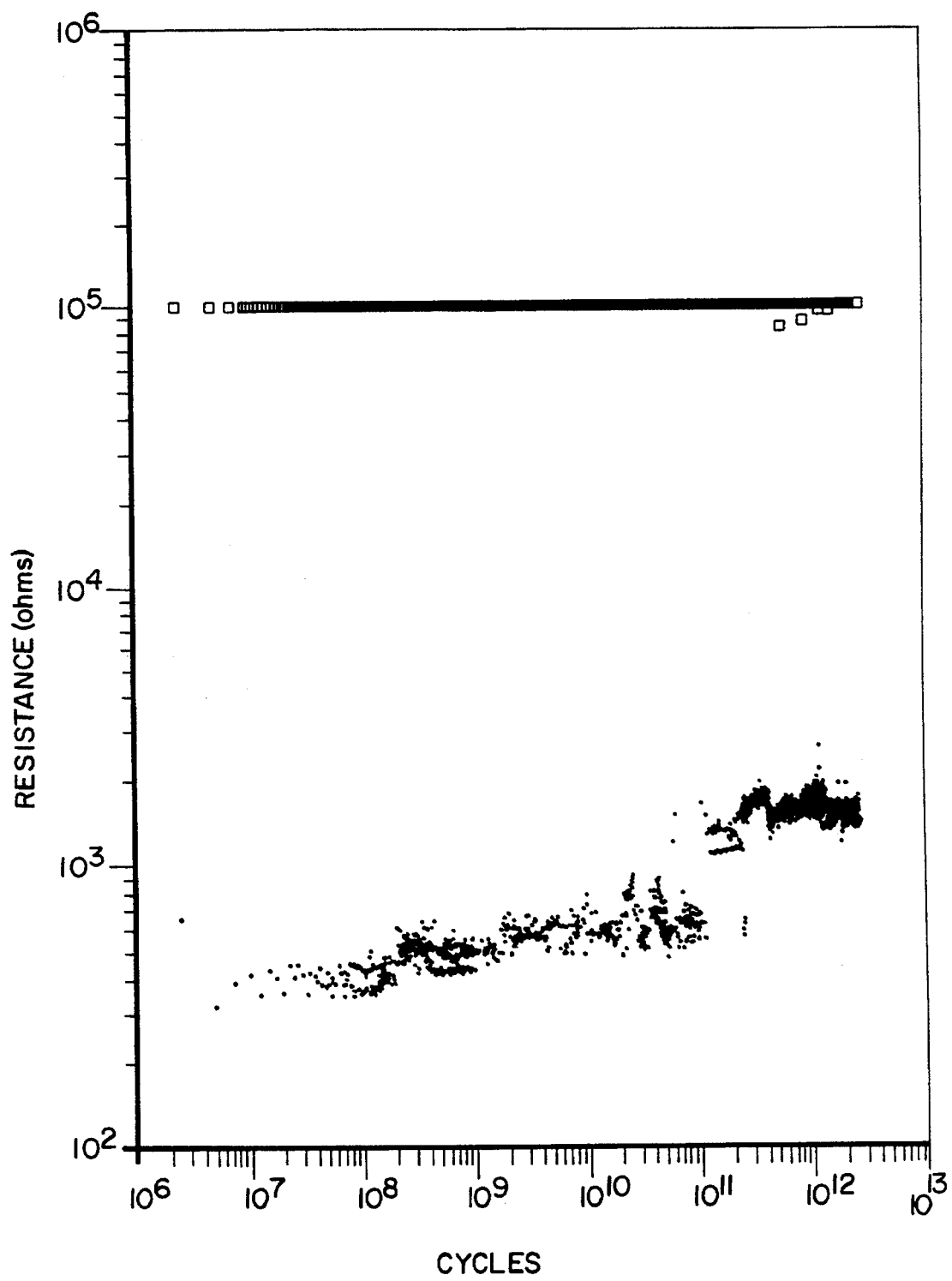
FIG. 12 is a graphical depiction of data illustrating cycling characteristics of a memory element with the silicon nitride filament confining layer of the present invention.

FIG. 12 is a graphical depiction of data illustrating cycling characteristics of a memory element with the silicon nitride filament confining layer of the present invention. In this graph, device resistance is plotted on the ordinate and cycle number is plotted on the abscissa. The data was created by cycling the memory element in binary fashion using 200 nsec, 2 Volt pulses to set the material to a "low" resistance and 50 nsec, 3 Volt pulses to set the material to a "high" resistance. As can be determined from this figure, the dynamic range of resistance for this device is relatively large, in the range of at least 100,000 ohms (see below). Also, the device has an extremely long cycle life, at least greater than $3\times10^{12}$ cycles, and the cycling current is relatively small (i.e. 200 nsec set pulses). The set resistance, while not unchanging, is relatively stable (within 500 ohms) for over 3 trillion cycles. Additionally, the discontinuity at about 100 billion cycles is due to adjustment of the contact probe which provides the electrical signal to the memory element. It should also be noted that while the reset resistance appears to be perfectly constant at 100,000 ohms throughout the entire 3 trillion cycles, this is a minimum value of resistance below which the true reset resistance does not fall and is therefore a somewhat artificial number. That is, in order to decrease the switching cycle time to a point at which the device could be switched 3 trillion times within a reasonable amount of time, the cycling machine was only programmed to determine if the resistance had fallen below the 100,000 ohm line. Therefore, even when the true resistance was above the 100,000 ohm cutoff, it was marked at 100,000 ohms.

Figure 13:
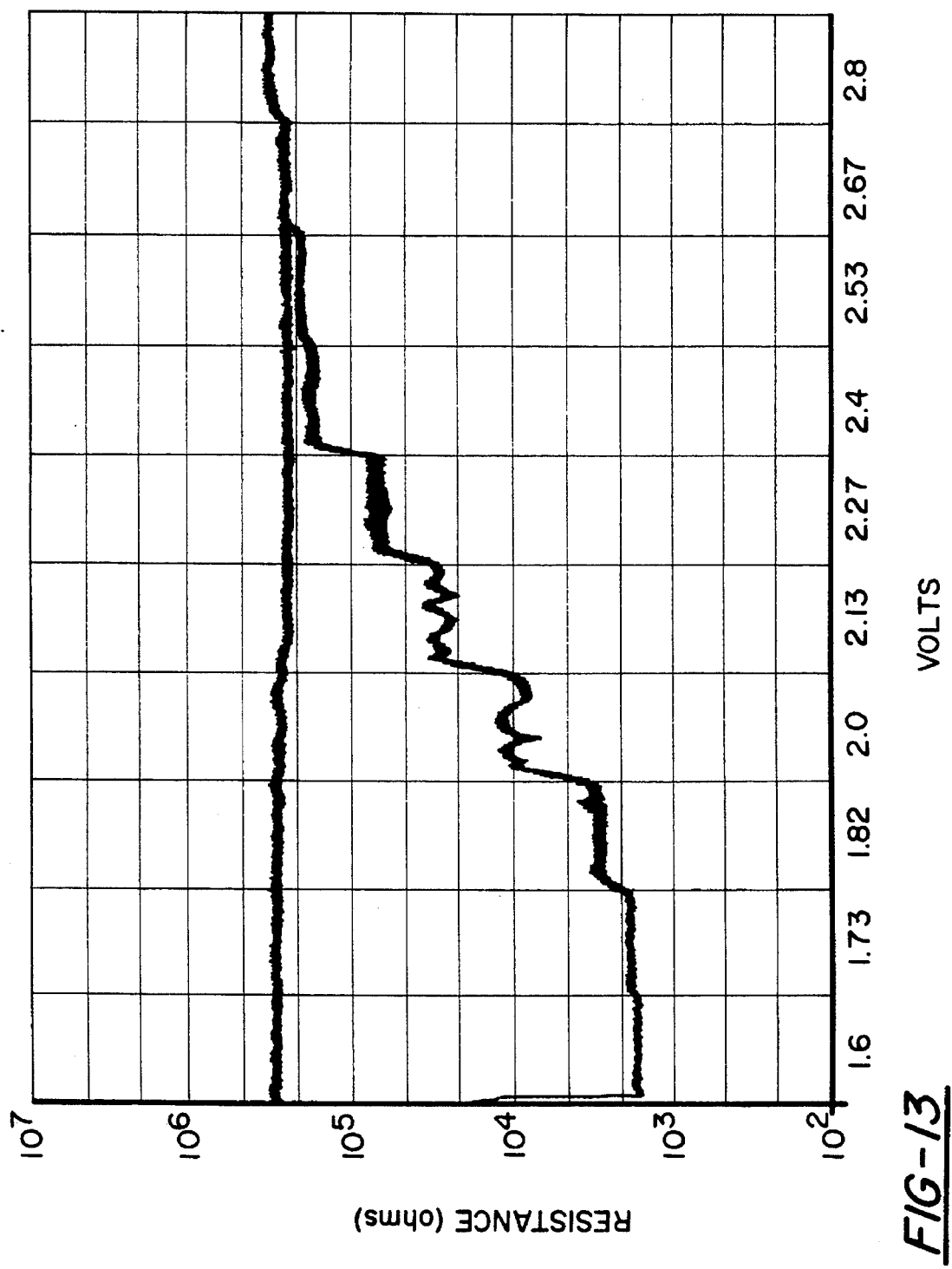
FIG. 13 is a graphical depiction of data illustrating multistate capabilities (i.e. ability of the memory element to be set to multiple resistance levels within the dynamic range of resistances) of a memory element with the silicon nitride filament confining layer of the present invention.

FIG. 13 is a graphical depiction of data illustrating multistate capabilities (i.e. ability of the memory element to be set to multiple resistance levels within the dynamic range of resistances) of a memory element with the silicon nitride filament confining layer of the present invention. In this graph, device resistance is plotted on the ordinate and set pulse voltage is plotted on the abscissa. The data was created by pulsing the memory element with 200 nsec set pulses of varying voltage from 1.6 to 2.8 volts. The memory element was pulsed with 10 pulses at 1.6 volts and the device resistance was measured. The voltage was increased to 1.73 volts and another 10 pulses were applied, again the device resistance was measured. The voltage was incremented in this manner up to 2.8 volts. This test was performed 5 times (i.e. five sets of incrementation from 1.6 to 2.8 volts). A perusal of this figure clearly indicates that the memory elements which have this filament confining layer exhibit multistate abilities.

The difference between the memory elements of FIGS. 8, 9, 10 and 11 and that of FIGS. 12 and 13 is that the former memory elements lacks the filament confining silicon nitride layer of the instant invention. This silicon nitride layer is formed between the lower electrode and the volume of memory material. The layer defines the size and position of the resistance switching filamentary portion of the volume of memory material during electrical formation of the memory element and limits the size and confines the location of the filamentary portion during use of the memory element, thereby providing for a high current density within said filamentary portion of said single cell memory element upon input of a very low total current electrical signal to said spacedly disposed contacts.

Electrical formation of the memory element consists of applying high voltage electrical pulses to the newly constructed memory element which "forms" the element for subsequent low voltage electrical cycling. Typically the forming process involves applying electrical pulses of increasing voltage until the memory element switches from its originally very high "virgin" resistance value to a low resistance value. This is the breakdown voltage of the silicon nitride layer. The as-deposited filament confining silicon nitride layer is highly resistive. During the formation process the filament confining layer is subjected to multiple high voltage EMF pulses. During one or more of these pulses, the electrically weakest (defect point in the confining layer is physically changed. Thereafter, this point is much more highly conductive than the remainder of the layer and is the point through which all of the current of any subsequent memory cycling pulses (i.e set and reset pulses) will pass. Therefore, this changed region created at the defect point within the confining layer defines the size and position of the resistance switching filamentary portion of the volume of memory material during electrical formation of the memory element. Also, since the defect point in the confining layer is fixed in size and location and does not move or grow in size throughout low current memory switching, it acts to limit the size and to confine the location of the filamentary portion during use of the memory element. This ultra small resistance switching filamentary portion allows for a high current density within said filamentary portion of said single cell memory element upon input of a very low total current electrical signal to memory element since all of the current is channeled therethrough.

Through the use of the proprietary materials and device configurations disclosed herein, an electrically erasable, directly overwritable memory element has been developed which provides fast read and write speeds, approaching those of SRAM devices; non-volatility and random access reprogramming capabilities of an EEPROM; and a price per megabyte of storage that approaches that of hard disk memory.

It is possible that the ramifications of the free charge concentration modulation capabilities of the materials of the present invention will have economic impact in the field of semiconductor devices. As detailed in the background section above, the charge carrier modulation disclosed herein represents a fifth type of charge carrier modulation, one that represents a fundamental departure from the prior art. Simply stated, in the materials of the present invention, even after removal of the field, the Fermi level position, the electrical conductivity, and the concentration of free charge remain fixed. Thus, it becomes possible to build either a new class of semiconductor devices in which three terminals or two terminals can be employed and the device is preprogrammed to preselected values of electrical resistivity. In either event, the programming voltages and/or currents are remarkably low and the reaction speeds are remarkably fast. This is because the semiconductor materials of the present invention have inherent speed and energy capabilities resulting from modulation that occurs within one or more different crystalline phases.

Note that, as should be apparent from a perusal of the subject specification, we are able to see a trend in performance of the memory elements that is generally related to pore diameter. When we use devices in the binary mode, we see a general increase in the off-to-on resistance ratio as we test devices across a wafer in which pore diameters range systematically from just over one micron to not open at all. If the pore diameter is controlled within the range of, for example, from one micron to less than one half of a micron, there is an opportunity to improve the performance of our devices. Since volumetric factors such as current density and energy density are important in the programming of our devices, reduction in device volume, resulting from reduction in pore diameter, should result in an increase in sensitivity and speed.

There is a threshold switching voltage associated with the programming of the Ovonic EEPROM and, therefore, one expects that, like threshold switches, the Ovonic EEPROM programming voltage will show a chalcogenide alloy film thickness dependence. In fact, in the Ovonic EEPROM, a threshold switching voltage serves to separate read events from programming events, eliminating read upset and providing good operational margin during data reading. Our devices show linear resistance characteristics when the applied field is low, followed by a gradual decrease in resistance with increasing field, up to a threshold voltage. Once the threshold voltage is exceeded, the device exhibits a negative resistance transition to a highly conductive, "dynamic on" state. When the applied field is removed, the device returns to a non-volatile programmed resistance state, the value of which depends on the current/energy profile the device has experienced during its "memory equilibration time" while in the dynamic on state. Although the threshold voltage depends on the resistance of the device, the device current at the threshold voltage is relatively constant for all device resistances. A linear approximation to the thickness, threshold voltage relationship shows a proportionality factor of less than one, which contributes to a wide operating margin in devices having the same nominal thickness.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. An electrically operated, directly overwritable, multibit, single-cell memory element comprising:

a volume of memory material defining a single cell memory element, said memory material characterized by (1) a large dynamic range of electrical resistance values, and (2) the ability to be set at one of a plurality of resistance values within said dynamic range in response to selected electrical input signals so as to provide said single cell with multibit storage capabilities;

a pair of spacedly disposed contacts for supplying said electrical input signal to set said memory material to a selected resistance value within said dynamic range;

at least a filamentary portion of said single cell memory element being setable, by said selected electrical signal to any resistance value in said dynamic range, regardless of the previous resistance value of said material; and a filamentary portion controlling means disposed between said volume of memory material and at least one of said spacedly disposed contacts, said means defining the size and position of said filamentary portion during electrical formation of the memory element and limiting the size and confining the location of said filamentary portion during use of the memory element, thereby providing for a high current density within said filamentary portion of said single cell memory element upon input of a very low total current electrical signal to said spacedly disposed contacts, wherein said filamentary portion controlling means comprises a layer of silicon nitride.

2. The memory element of claim 1, wherein said filamentary portion controlling means comprises a thin film layer silicon nitride disposed between one of the spacedly disposed contacts and the volume of memory material, said thin film layer is less than about 100 Angstroms thick.

3. The memory element of claim 2, wherein said filamentary portion controlling means comprises a thin film layer of silicon nitride between 10 and 100 Angstroms thick.

4. The memory element of claim 2, wherein said thin film layer of silicon nitride contains at least one low resistance pathway thereacross, through which input electrical signals pass between said spacedly disposed contact and said volume of memory material.

5. The memory element of claim 3, wherein said thin film layer of silicon nitride comprises Si, N and H.

6. The memory element of claim 5, wherein said filamentary portion controlling means comprises a thin film layer formed of, in atomic percent, between about 30–40% silicon, 40–50% nitrogen, up to 30% hydrogen and the remainder impurities.

7. The memory element of claim 1, wherein the memory material forming said volume of memory material is selected from the group consisting of Se, Te, Ge, Sb and mixtures or alloys thereof.

8. The memory element of claim 7, wherein said memory material includes Te, Ge and Sb in the ratio $Te_aGe_bSb_{100-(a+b)}$ where the subscripts are in atomic percentages which total 100% of the constituent elements and $40 \leq a \leq 58$ and $8 \leq b \leq 40$.

9. The memory element of claim 7, wherein said memory material further includes one or more elements selected from the group consisting of Cr, Fe, Ni, Bi, Pb, Sn, As, S, Si, P, O and mixtures or alloys thereof.

10. The memory element of claim 7, wherein said volume of memory material including means for varying the positional composition of said volume of memory material so as to substantially stabilize the resistance of said material at a selected resistance value and said volume of memory material adapted to remain set at said selected resistance value without drift after the input signal has been terminated.

11. The memory element of claim 10, wherein said means for varying the composition includes compositionally grading said volume of memory material.

12. The memory element of claim 10, wherein said means for varying the composition includes compositionally layering said volume of memory material.

13. The memory element of claim 10, wherein said means for varying the composition includes compositionally grading and compositionally layering said volume of memory material.

14. The memory element of claim 11, wherein said compositional grading includes a composition of $Ge_{14}Sb_{29}Te_{57}$ graded to $Ge_{22}Sb_{22}Te_{56}$.

15. The memory element of claim 12, wherein said compositional layering includes discrete layers of $Ge_{14}Sb_{29}Te_{57}$ and $Ge_{22}Sb_{22}Te_{56}$.

16. The memory element of claim 13, wherein said combination of compositional layering and compositional grading includes a layer of $Ge_{22}Sb_{22}Te_{56}$ and a graded composition of $Ge_{14}Sb_{29}Te_{57}$ and $Ge_{22}Sb_{22}Te_{56}$.

17. The memory element of claim 13, wherein said combination of compositional layering and compositional grading includes a layer of $Ge_{14}Sb_{29}Te_{57}$ and a graded composition of $Ge_{14}Sb_{29}Te_{57}$ and $Ge_{22}Sb_{22}Te_{56}$.

18. The memory element of claim 1, wherein said volume of memory material and said contacts are formed so as to define a matrix array of thin film material; each memory element in said array being addressably isolated from other memory element in the array by thin film isolation devices.

19. The memory element of claim 18, wherein the combination of thin film memory elements and isolation devices define a three dimensional, multilevel array of discreetly addressable high density memory cells.

20. The memory element of claim 1, wherein said volume of memory material is operatively disposed in a pore of less than about 1 micron.

21. The memory element of claim 1, wherein said selected electrical input signal which sets said memory material to a desired resistance value is at least one pulse of a selected pulse duration of between about 100 and about 500 nanoseconds using a pulse voltage of between about 1 and about 2 volts and a pulse current of between about 0.5 and about 1 milliamperes.

* * * * *